United States Patent
Yun et al.

(10) Patent No.: US 10,832,781 B2
(45) Date of Patent: Nov. 10, 2020

(54) INTEGRATED CIRCUIT DEVICE

(71) Applicant: SAMSUNG ELECTRONICS CO., LTD., Suwon-si (KR)

(72) Inventors: Jang-Gn Yun, Hwaseong-si (KR); Jae-Duk Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/550,591

(22) Filed: Aug. 26, 2019

(65) Prior Publication Data
US 2020/0273877 A1  Aug. 27, 2020

(30) Foreign Application Priority Data

Feb. 27, 2019 (KR) .................. 10-2019-0023287

(51) Int. Cl.
*G11C 16/14* (2006.01)
*G11C 16/04* (2006.01)

(52) U.S. Cl.
CPC .......... *G11C 16/14* (2013.01); *G11C 16/0483* (2013.01)

(58) Field of Classification Search
CPC ......... H01L 27/11582; H01L 27/11573; H01L 23/528; G11C 16/0483; G11C 16/14
See application file for complete search history.

(56) References Cited

U.S. PATENT DOCUMENTS

| | | | |
|---|---|---|---|
| 8,427,881 B2 | 4/2013 | Jang et al. | |
| 8,537,615 B2 | 9/2013 | Maeda | |
| 8,923,072 B2 | 12/2014 | Oh | |
| 9,236,126 B2 | 1/2016 | Lee | |
| 9,355,913 B2 | 5/2016 | Park et al. | |
| 9,378,831 B2 | 6/2016 | Han et al. | |
| 9,613,980 B2 | 4/2017 | Yamada et al. | |
| 9,721,668 B2 | 8/2017 | Yeh et al. | |
| 9,837,165 B2 | 12/2017 | Lee et al. | |
| 9,916,901 B1* | 3/2018 | Saito | H01L 27/1157 |
| 9,953,710 B2 | 4/2018 | Liu et al. | |
| 2015/0131387 A1* | 5/2015 | Jeon | G11C 16/08 365/185.29 |

* cited by examiner

*Primary Examiner* — Ajay Ojha
(74) *Attorney, Agent, or Firm* — Volentine, Whitt & Francos, PLLC

(57) ABSTRACT

An integrated circuit device includes channel structures extending from a substrate in a vertical direction, memory cell strings disposed along the plurality of channel structures, gate lines spaced apart from one another in the vertical direction and including erase control lines and string selection lines, and driving transistors including erase control driving transistors connected to the erase control lines and string selection driving transistors connected to the string selection lines.

20 Claims, 30 Drawing Sheets

INTEGRATED CIRCUIT DEVICE

CROSS-REFERENCE TO RELATED APPLICATION

This application claims the benefit of Korean Patent Application No. 10-2019-0023287, filed on Feb. 27, 2019 in the Korean Intellectual Property Office, the disclosure of which is incorporated herein in its entirety by reference.

BACKGROUND

The inventive concept relates generally to integrated circuit devices. More particularly, the inventive concept relates to integrated circuit devices including a vertical memory device.

Contemporary integrated circuit devices demand ever greater data storage capacity while maintaining relatively small physical sizes. This compound set od demands requires ever greater integration density. Vertical memory devices provide memory cells stacked on a substrate in a vertical direction. In order to increase the data storage capacity of vertical memory devices, the number of stacked memory cells must be increased while maintaining efficient read, writes and/or erase operations.

SUMMARY

Embodiments of the inventive concept provides integrated circuit devices in which the number of stacked memory cells may be increased, yet controlled.

According to an aspect of the inventive concept, there is provided an integrated circuit device including; a plurality of channel structures extending in a vertical direction from a main surface of a substrate, a plurality of memory cell strings disposed in the vertical direction along the plurality of channel structures, wherein each memory cell string includes a plurality of serially-connected memory cells, a plurality of gate lines spaced apart from one another in the vertical direction and including erase control lines and string selection lines; and a plurality of driving transistors including erase control driving transistors connected to the erase control lines and string selection driving transistors connected to the string selection lines, wherein at least two gate lines spaced apart from one another in a horizontal direction with respect to the main surface of the substrate among the plurality of gate lines are commonly connected to one of the plurality of driving transistors.

According to another aspect of the inventive concept, there is provided an integrated circuit device including; channel structures extending in a vertical direction from a substrate, bit lines respectively connected to the channel structures and extending in a first horizontal direction, gate electrodes vertically stacked on the substrate, intersecting the channel structures, having a stepped pattern, and extending in a second horizontal direction over the substrate, and an erase control driving transistor and at least two string selection driving transistors. At least two of the gate electrodes respectively function as erase control lines, at least another two of the gate electrodes respectively function as string selection lines, the erase control lines and the string selection lines are spaced apart from one another in the first horizontal direction, the erase control lines are commonly connected to the erase control driving transistor, and each of the string selection lines is respectively connected to one of the at least two string selection driving transistors.

According to another aspect of the inventive concept, there is provided an integrated circuit device including; channel structures extending in a vertical direction from a substrate, memory cell strings disposed in the vertical direction along the channel structures, wherein each one of the memory cell strings includes serially-connected memory cells, gate electrodes spaced apart from one another in the vertical direction, intersecting the channel structures, and extending in a second horizontal direction over the substrate, and driving transistors including erase control driving transistors and string selection driving transistors, wherein the gate electrodes include word lines, erase control lines, and string selection lines, the at least two of the erase control lines are spaced apart from one another in a first horizontal direction and are commonly connected to one erase control driving transistor, and the at least two string selection lines are spaced apart from one another in the first horizontal direction and are respectively connected to the at least two string selection driving transistors.

According to another aspect of the inventive concept, there is provided an integrated circuit device including; a plurality of channel structures extending from a substrate in a vertical direction with respect to a main surface of the substrate, at least two memory cell strings having a plurality of memory cells, string selection transistors, and erase control transistors serially connected along at least two of the plurality of channel structures, and at least two erase control lines connected to the erase control transistor of each of the at least two memory cell strings and spaced apart from one another in a horizontal direction, wherein the erase control transistor of each of the at least two memory cell strings performs an erase operation by one erase control driving transistor commonly connected to the at least two erase control lines.

BRIEF DESCRIPTION OF THE DRAWINGS

Embodiments of the inventive concept may be more clearly understood from the following detailed description taken in conjunction with the accompanying drawings in which.

DETAILED DESCRIPTION

Figure 1:
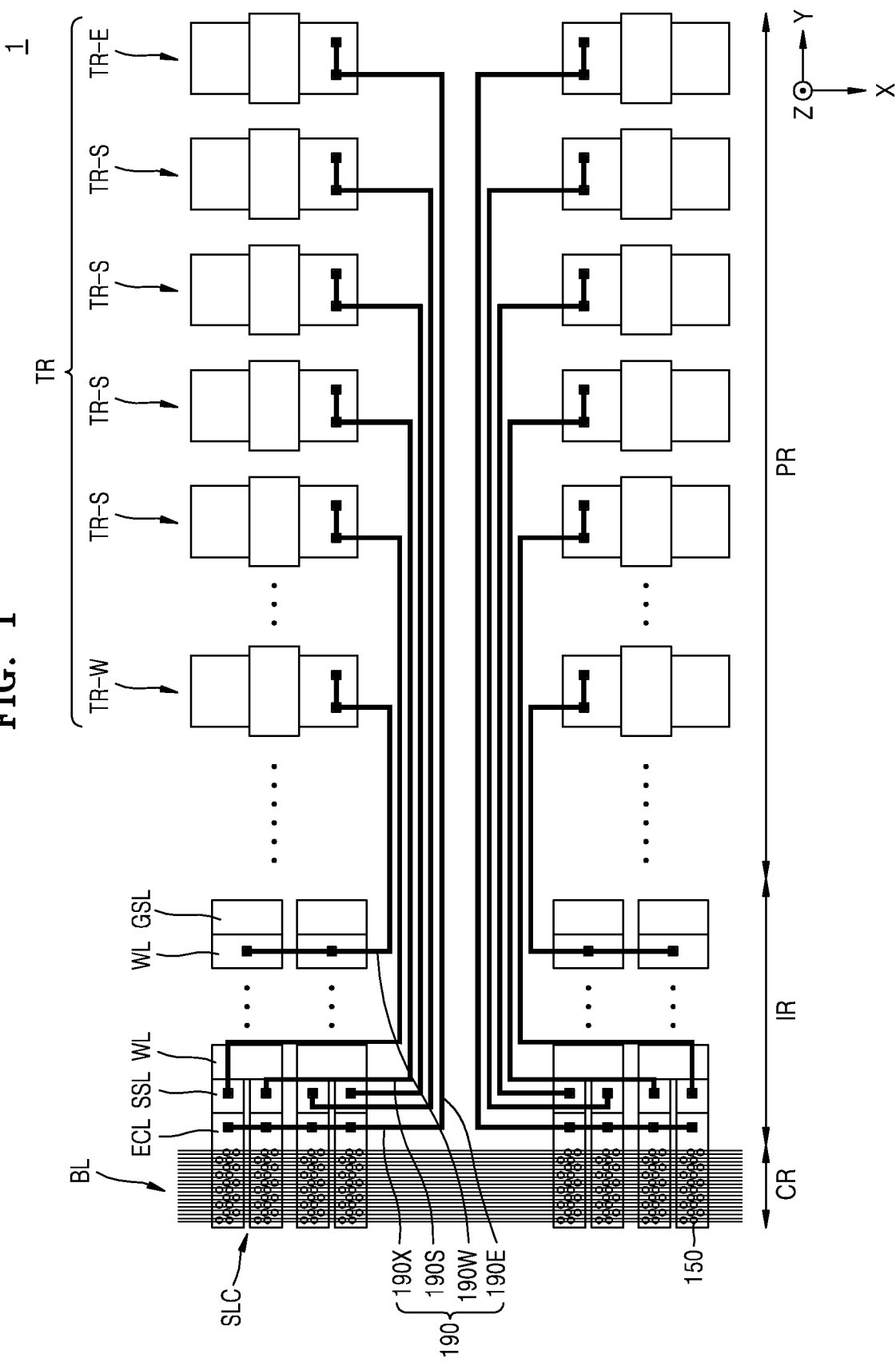
FIG. 1 is a plan view illustrating main components of an integrated circuit device according to an embodiment of the inventive concept.
Figure 2A:
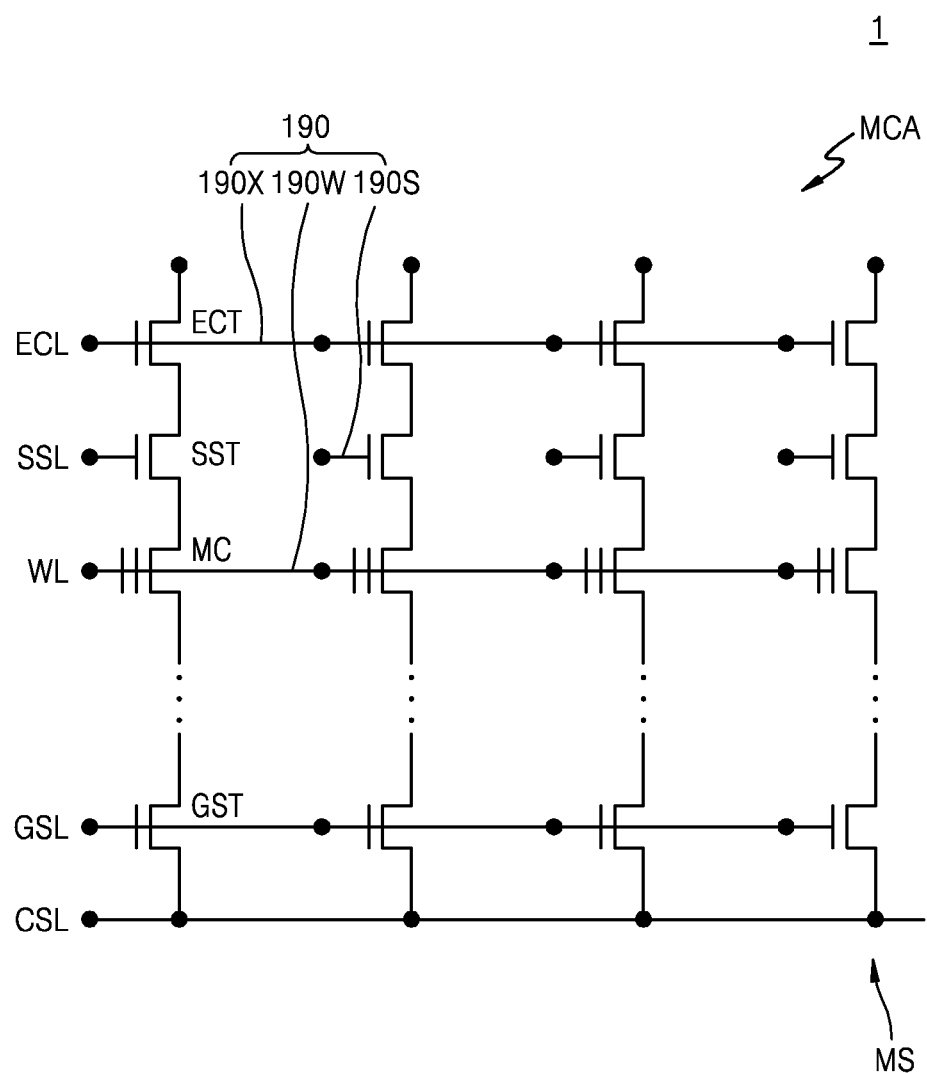
FIG. 2A is an equivalent circuit diagram of a memory cell array of an integrated circuit device according to an embodiment of the inventive concept.
Figure 2B:
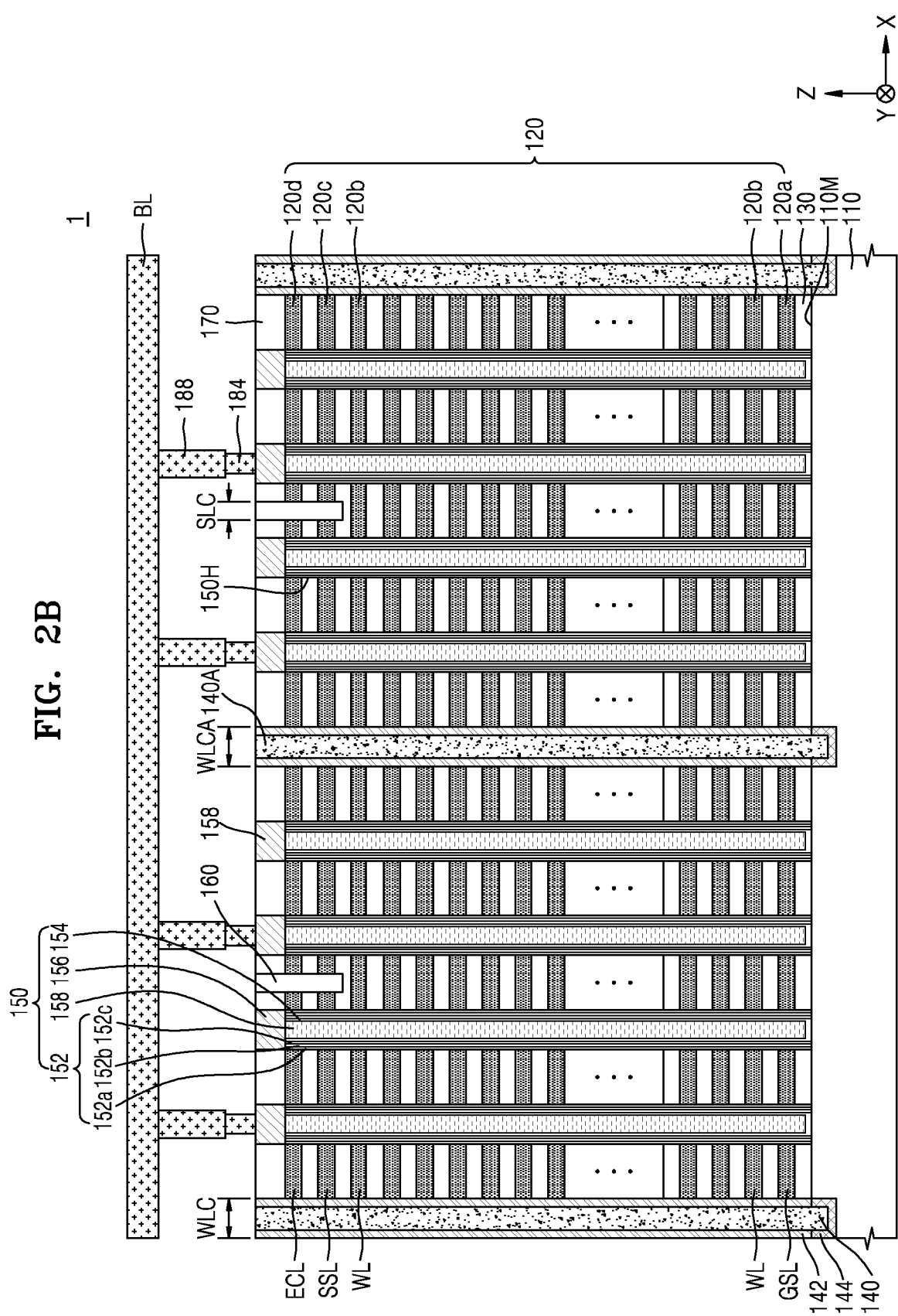
FIGS. 2B and 2C are cross-sectional views of an integrated circuit device according to embodiments of the inventive concept.
Figure 2C:
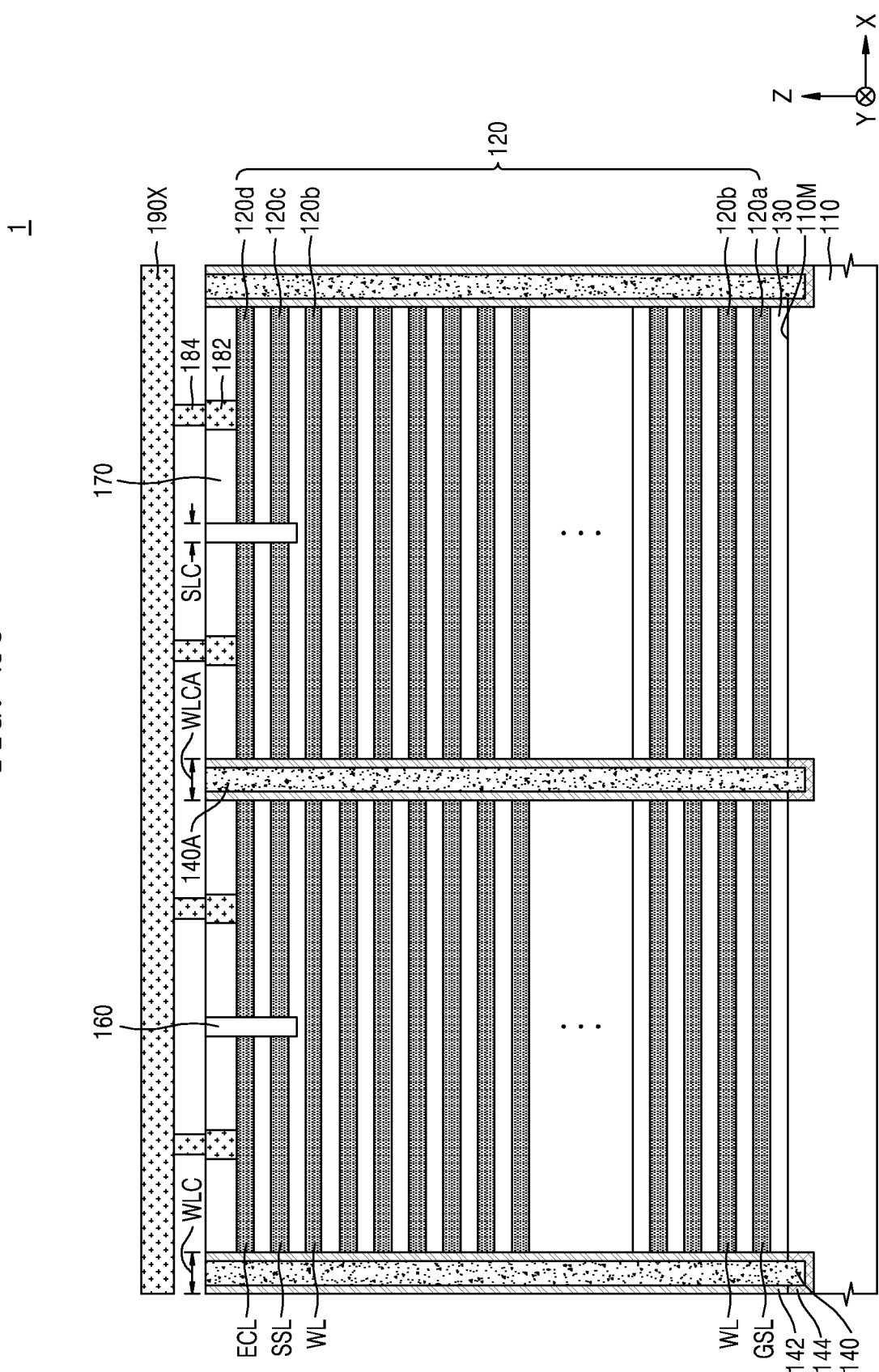

Figure (FIG. 1 is a plan view illustrating an integrated circuit device 1 according to embodiments of the inventive concept. FIG. 2A is an equivalent circuit diagram for the memory cell array (MCA) of the integrated circuit device 1 according to an embodiments of the inventive concept. FIGS. 2B and 2C are respective, cross-sectional views of the integrated circuit device 1 according to embodiments of the inventive concept, wherein FIG. 2B is a cross-sectional view taken along a bit line BL and FIG. 2C is a cross-sectional view taken along a common connection wiring line 190X for electrically connecting (hereafter, "connecting") an erase control line ECL.

Embodiments of the inventive concept relate generally to integrated circuits including a vertically configured memory cell array MCA. Thus, the integrated circuit device 1 illustrated in FIGS. 1, 2A, 2B and 2C, is a vertical NAND (VNAND) flash memory device having a vertical channel structure. In this regard, those skilled in the art will recognize that the terms "vertical" and "horizontal" are used to describe relative spatial orientations of constituent components and features. For example, a primary surface of a substrate may serve as a convenient geometric reference from which various coordinate "directions" (e.g., X, Y, and Z directions) are defined, wherein one of these directions (e.g., the Z direction) is identified as the vertical direction, and the other directions (e.g., the X direction and the Y direction) are identified as orthogonally-related horizontal directions. However, such relative spatial orientations and general geometric relationships are merely descriptive in nature.

Using a primary, upper horizontal surface 110M of the principal substrate 110 as a reference, as shown for example in FIGS. 2A and 2B, the memory cell array MCA may be understood as including a plurality of memory cell strings MS that vertically extends from the substrate 110 in the vertical direction. In certain embodiments of the inventive concept, the plurality of memory cell strings MS may be respectively disposed on the substrate 110 along a plurality of vertically extending channel structures 150.

Each of the plurality of memory cell strings MS may include a serially-connected arrangement of at least one ground selection transistor GST, a plurality of memory cells MC, at least one string selection transistor SST, and at least one erase control transistor ECT. Here, each one of the plurality of memory cells MC may be used to store single-bit or multi-bit data, wherein word lines WL are respectively connected to a corresponding memory cell MC and may be used to control, at least in part, the operation of the memory cell MC.

A gate terminal of the ground selection transistor GST may be connected to a ground selection line GSL and a source terminal of the ground selection transistor GST may be connected to a common source line CSL. A gate terminal of the string selection transistor SST may be connected to a string selection line SSL, a source terminal of the string selection transistor SST may be connected to a drain terminal of a memory cell MCn, and a drain terminal of the string selection transistor SST may be connected to the bit line BL through a source terminal of the erase control transistor ECT. A gate terminal of the erase control transistor ECT may be connected to the erase control line ECL, the source terminal of the erase control transistor ECT may be connected to the drain terminal of the string selection transistor SST, and a drain terminal of the erase control transistor ECT may be connected to the common connection wiring line 190X.

With the foregoing example in mind, it should be noted that each memory cell string MS may include; one ground selection transistor GST, one string selection transistor SST, and one erase control transistor ECT. Alternately, each memory cell string MS may include multiple ground selection transistors GST, multiple string selection transistors SST, and multiple erase control transistors ECT. Alternately, each memory cell string MS may omit the ground selection transistor GST. However, these are just selected example, and memory cell string(s) of great variety may be used in various embodiments of the inventive concept.

When a signal is applied to the gate terminal of the string selection transistor SST through the string selection line SSL, the signal applied through the bit line BL is provided to the plurality of memory cells MC. As a result, a data write operation may be performed. When a signal is applied to the gate terminal of the erase control transistor ECT through the erase control line ECL, an erase operation for the plurality of memory cells MC may be performed using a gate induced drain leakage (GIDL) current generated by the erase control transistor ECT. In this regard it should be noted that erase operations may be performed on a unit block by unit block basis using the GIDL current.

Referring to FIG. 1, the substrate 110 may be conceptually divided into a memory cell region CR, a connection region IR, and a peripheral circuit region PR. The substrate 110 may include a semiconductor material, for example, a Group IV semiconductor, a Group III-V compound semiconductor, or a Group II-VI oxide semiconductor. For example, the Group IV semiconductor may include silicon (Si), germanium (Ge), or Si—Ge. The substrate 110 may be provided as a bulk wafer or an epitaxial layer. In another embodiment, the substrate 110 may include a silicon-on-insulator (SOI) substrate or a germanium-on-insulator (GeOI) substrate.

Here, the memory cell array MCA may be disposed in the memory cell region CR, and a plurality of driving transistors TR for driving the memory cell array MCA may be disposed in the peripheral circuit region PR.

Assuming that the upper surface 110M of the substrate 110 is horizontally defined by the first horizontal direction (i.e., the X direction) and the second horizontal direction (i.e., the second horizontal direction), the memory cell region CR, connection region IR, and peripheral circuit region PR may be understood as sequentially extending in the second horizontal direction along the substrate 110. That is, the peripheral circuit region PR may be separated from the memory cell region CR in the second horizontal direction by the intervening connection region IR.

Referring to FIGS. 1, 2A, 2B and 2C, a plurality of gate electrodes 120 may be formed on the substrate 110 extending in the second horizontal direction and spaced apart from each other in the vertical direction. Here, the plurality of gate electrodes 120 may extend in the second horizontal direction across the substrate 110, as well as upward in the vertical direction in a stepped arrangement along the second horizontal direction.

In certain embodiments of the inventive concept, the plurality of gate electrodes 120 may correspond to at least one ground selection line GSL that configures a memory cell string MS, the plurality of word lines WL, at least one string selection line SSL, and at least one erase control line ECL. For example, at least one gate electrode 120a may be disposed lowermost among the memory cell array MCA and may function as the ground selection line GSL, at least one gate electrode 120d may be disposed uppermost among of the memory cell array MCA and may function as the erase control line ECL, at least one gate electrode 120c may be disposed below the at least one gate electrode 120d and may function as the string selection line SSL, and a plurality of remaining gate electrodes 120b may function as respective word lines WL.

In the foregoing example and throughout the description that follows, certain geometric or spatially relative terms such as; "upper", "lower", "uppermost", "lowermost", "upward", "downward", "above", and "below" may be used in relation to previously assumed, descriptive relationships. For example, given a defined vertical relationship or direction, one component may be said to be above or below another component.

In the foregoing example, among the plurality of gate electrodes 120, in order to distinguish the plurality of gate electrodes 120b that function as the word lines WL from the gate electrodes 120a, 120c, and 120d that function as the ground selection line GSL, the string selection line SSL, and the erase control line ECL, the plurality of gate electrodes 120b that function as the word lines WL may hereafter be referred to as "word lines" and the gate electrodes 120a, 120c, and 120d that function as the ground selection line GSL, the string selection line SSL, and the erase control line ECL may hereafter be referred to as "gate lines." Thus, it is understood that the plurality of gate electrodes 120 may include a plurality of word lines and a plurality of gate lines.

The possible inclusion and use of one or more dummy line(s) is also contemplated in certain embodiments of the inventive concept. For example, one or more of the plurality of gate electrodes 120 (e.g., word line(s) 120b, string selection line(s) SSL 120c, and/or erase control line(s) ECL 120(d) may function as a dummy line. (See, e.g., component(s) 120e in FIGS. 8 through 13 hereafter).

In other embodiments (see, e.g., the examples described in relation to FIGS. 4A through 7 hereafter), among the plurality of gate electrodes 120, at least one gate electrode 120d-U in an uppermost portion (or position) and at least one gate electrode 120d-D in the lowermost portion may function as an upper erase control line ECL-U and a lower erase control line ECL-D. Alternatively, in other embodiments such as those illustrated in FIGS. 16, 17 and 18, when the plurality of gate electrodes 120 comprises at least two stacks ST1 and ST2, the at least one gate electrode 120d-U in the uppermost portion of each of the stacks ST1 and ST2 may function as each of upper erase control lines ECL-U1 and ECL-U2. In some embodiments, the at least one gate electrode 120d-D in the uppermost portion of each of the stacks ST1 and ST2 may function as each of the lower erase control lines ECL-D1 and ECL-D2.

As illustrated in FIGS. 2B and 2C, an insulating layer 130 may be disposed between the substrate 110 and the lowermost gate electrode 120a, as well as between each of the plurality of gate electrodes 120. In addition, the insulating layer 130 may be disposed on the gate electrode 120d in the uppermost portion.

A plurality of word line cut regions WLC may be disposed in the substrate 110 extending in the second horizontal direction, where the plurality of gate electrodes 120 is disposed between adjacent word line cut regions WLC to configure one block. The adjacent pair of word line cut regions WLC may limit widths of the plurality of gate electrodes 120 in the first horizontal direction. An intermediate word line cut region WLCA may (optionally) be disposed between the pair of word line cut regions WLC in the second horizontal direction.

A plurality of common source lines 140 that vertically overlap the plurality of word line cut regions WLC may be disposed on the substrate 110 in the second horizontal direction. In addition, a plurality of intermediate common source lines 140A that vertically overlap the intermediate word line cut region WLCA may be disposed on the substrate 110 in the second horizontal direction. An insulating spacer 142 may be disposed on opposing sidewalls of each common source line 140, as well as the intermediate common source lines 140A. For example, the insulating spacer 142 may be disposed between each common source line 140 and gate electrode 120, as well as between each intermediate common source line 140A and gate electrode 120. In certain embodiments of the inventive concept, the plurality of common source lines 140 and the plurality of common source lines 140A may extend below the main surface 110M of the substrate 110.

A plurality of common source regions 144 may be selectively disposed in the substrate 110 under the plurality of common source lines 140 in the second horizontal direction. The plurality of common source regions 144 may be impurity regions doped with n-type impurities at high density. The plurality of common source regions 144 may function as respective source regions supplying electrical charge to memory cells. The plurality of common source regions 144 may overlap the plurality of word line cut regions WLC.

Each one of the plurality of channel structures 150 may vertically extend upward through the memory cell region CR from the main surface 110M of the substrate 110 through the plurality of gate electrodes 120 in the Z direction. Here, the channel structures 150 may be spaced apart from one another at prescribed intervals in the first horizontal direction, the second horizontal direction, and/or some diagonal (e.g., a composite of the first and second horizontal directions) direction. Hence, in certain embodiments of the inventive concept, the plurality of channel structures 150 may be disposed in a zigzag or staggered pattern.

The plurality of channel structures 150 may be respectively disposed in channel holes 150H that extend through the gate electrodes 120, insulating layer 130, and interlayer insulating layer 170. A gate insulating layer 152 and a channel layer 154 may be sequentially disposed on an inner wall of each channel hole 150H. A buried insulating layer 156 may be disposed on the channel layer 154 to fill a space in each of the channel holes 150H.

A conductive plug 158 contacting the channel layer 154 and closing an upper opening of each channel hole 150H may be disposed on each of the channel holes 150H. In some embodiments, the conductive plug 158 may include a semiconductor material doped with impurities at high density and the channel layer 154 may include a semiconductor material that is not doped with impurities or a semiconductor material doped with impurities at lower density than the conductive plug 158. In other embodiments, the buried insulating layer 156 is omitted and the channel layer 154 may be in a form of a pillar that fills a residual portion of each of the channel holes 150H. Although not shown, the integrated circuit device 1 may further include a dummy channel structure for securing structural stability in processes of manufacturing the integrated circuit device 1. The dummy channel structure may have a similar structure to that of each of the plurality of channel structures 150.

The gate insulating layer 152 may include a blocking dielectric layer 152a, a charge storage layer 152b, and a tunnelling dielectric layer 152c that are sequentially formed from each of the plurality of gate electrodes 120 to the channel layer 154. The blocking dielectric layer 152a may include a silicon oxide, a silicon nitride, or a metal oxide with a larger dielectric constant than that of the silicon oxide. The metal oxide may be a hafnium oxide, an aluminium oxide, a zirconium oxide, a tantalum oxide, or a combination of the above oxides. The charge storage layer 152b may include poly-silicon or poly-silicon doped with impurities. In some embodiments, the charge storage layer 152b may be a charge trap layer formed of the silicon nitride, a boron nitride, or a silicon boron nitride. The tunnelling dielectric layer 152c may include the silicon oxide, the hafnium oxide, the aluminium oxide, the zirconium oxide, or the tantalum oxide.

Each of the at least two gate electrodes 120c and 120d in the uppermost portion may be divided into at least two lines by a string isolation insulating layer 160. For example, a string selection line cut region SLC may extend between a word line cut region WLC and an intermediate word line cut region WLCA, or between a pair of word line cut regions WLC in the second horizontal direction and the string isolation insulating layer 160 may be disposed in the string selection line cut region SLC. Therefore, each of the erase control line ECL and the string selection line SSL may have a lesser width than that of the word line WL in the first horizontal direction. The width of each of the erase control line ECL and the string selection line SSL in the first horizontal direction may be less than ½ the width of the word line WL in the first horizontal direction. For example, relative to the width of a word line WL in the first horizontal direction, two physically separate (or divided) erase control lines ECL and/or two physically separate string selection lines SSL may be disposed.

In some embodiments, a first width for each of the erase control lines ECL and a second width for each of the string selection lines SSL in the first horizontal direction may be equal. However, when the string isolation insulating layer 160 is tapered and accordingly, the string isolation insulating layer 160 extending to the substrate 110 and a width of the string isolation insulating layer 160 in the first horizontal direction is gradually reduced, the width of the erase control line ECL in the first horizontal direction may be slightly greater than the width of the string selection line SSL in the first horizontal direction.

In certain embodiments of the inventive concept, a plurality of bit lines BL may be spaced apart from one another at uniform intervals in the second horizontal direction and may extend in the first horizontal direction. The plurality of bit lines BL may be connected to the plurality of channel structures 150. For example, the plurality of bit lines BL and the plurality of channel structures 150 may be connected through conductive studs 184 disposed on the conductive plugs 158 of the plurality of channel structures 150 and upper conductive vias 188 disposed between the conductive studs 184 and the plurality of bit lines BL. In some embodiments, a pair of neighboring bit lines BL may be alternately connected through the plurality of channel structures 150, the conductive studs 184, and the upper conductive vias 188. However, the inventive concept is not limited thereto. The plurality of channel structures 150 and the plurality of bit lines BL may be connected by various methods considering an arrangement method of the plurality of channel structures 150, a horizontal width of each of the plurality of channel structures 150, and/or a horizontal width of each of the plurality of bit lines BL.

The plurality of gate electrodes 120 and the plurality of driving transistors TR may be connected by a plurality of connection wiring lines 190. The plurality of gate electrodes 120 and the plurality of connection wiring lines 190 may be connected through lower conductive vias 182 connected onto parts of the plurality of gate electrodes 120 of the connection region IR and the conductive studs 184 disposed between the lower conductive vias 182 and the plurality of connection wiring lines 190.

The plurality of driving transistors TR may be connected to the plurality of gate electrodes 120 initially. The plurality of driving transistors TR and the plurality of gate electrodes 120 may be connected only through conductive paths such as the lower conductive vias 182, the conductive studs 184, the plurality of connection wiring lines 190, or conductive via plugs (not shown) for connecting the plurality of connection wiring lines 190 to the plurality of driving transistors TR.

In the connection region IR, one end of the stepped gate electrode 120 may be referred to as a pad layer connected to the lower conductive via 182. The resulting heights of the plurality of lower conductive vias 182 formed on the pad layer of the plurality of gate electrodes 120 in the vertical direction may vary in accordance with relative vertical position(s) of the plurality of gate electrodes 120. The plurality of connection wiring lines 190 may extend from the pad layer of the plurality of gate electrodes 120 to the plurality of driving transistors TR.

The plurality of connection wiring lines 190 may include; the common connection wiring line 190X, an extension connection wiring line 190E, a string connection wiring line 190S, and a gate connection wiring line 190W. The common connection wiring line 190X and the extension connection wiring line 190E may be connected to the erase control line ECL, the string connection wiring line 190S may be connected to the string selection line SSL, and the gate connection wiring line 190W may be connected to the word line WL or a ground selection line CSL.

The plurality of driving transistors TR may include a word line driving transistor TR-W connected to the word line WL, a string selection driving transistor TR-S connected to the string selection line SSL, and an erase control driving transistor TR-E connected to the erase control line ECL.

The word line driving transistor TR-W may be connected to the word line WL through the gate connection wiring line 190W. In FIG. 1, only a single word line driving transistor TR-W and only a single gate connection wiring line 190W are shown in order to preserve illustrative clarity. However, the integrated circuit device 1 may include a plurality of word line driving transistors TR-W and a plurality of gate connection wiring lines 190W respectively connected to a plurality of word lines WL disposed at different levels in the vertical direction.

The driving transistors TR may further include a ground selection driving transistor connected to the ground selection line GSL, and the plurality of connection wiring lines 190 may further include a ground selection connection wiring line for connecting the ground selection driving transistor to the ground selection line GSL. However, since the ground selection connection wiring line and the ground selection driving transistor that are connected to the ground selection line GSL are similar to the gate connection wiring line 190W and the word line driving transistor TR-W connected to the word line WL, the ground selection connection wiring line and the ground selection driving transistor are not illustrated or repetitively described.

The string selection driving transistor TR-S may be connected to the string selection line SSL through the string connection wiring line 190S. The integrated circuit device 1 may include a plurality of string connection wiring lines 190S and a plurality of string selection driving transistors TR-S respectively connected to a plurality of physically divided string selection lines SSL.

The erase control driving transistor TR-E may be connected to a plurality of erase control lines ECL through the common connection wiring line 190X and the extension connection wiring line 190E. The common connection wiring line 190X and the extension connection wiring line 190E may be referred to as erase control connection wiring lines.

The gate connection wiring line 190W, the string connection wiring line 190S, and the extension connection wiring line 190E may extend in the first horizontal direction and/or the second horizontal direction. However, a layout configuration (e.g., the layout design, geometry, or shape) of the gate connection wiring line 190W, string connection wiring line 190S, and extension connection wiring line 190E shown in FIG. 1 is an example.

The plurality of physically divided string selection lines SSL are respectively connected to the plurality of string selection driving transistors TR-S through the physically divided string connection wiring lines 190S. At least two of the plurality of physically divided erase control lines ECL may be connected to the one erase control driving transistor TR-E by the one erase control connection wiring line. That is, the one common connection wiring line 190X and the one extension connection wiring line 190E may be connected to each other. The common connection wiring line 190X extending in the first horizontal direction (the direction in which the bit line BL extends) may be connected to at least two erase control lines ECL. That is, the common connection wiring line 190X extending in the first horizontal direction and connects at least two erase control lines ECL in the erase control connection wiring lines. For example, the common connection wiring line 190X may extend along one end of each of the plurality of erase control lines ECL on the connection region IR, that is, on the pad layer in the first horizontal direction and may connect the plurality of erase control lines ECL in one block.

For example, the number of string selection driving transistors TR-S corresponding to the physically divided string selection lines SSL may be greater than the number of erase control driving transistors TR-G corresponding to the physically divided erase control lines ECL.

Since integrated circuit devices like the one illustrated in FIGS. 1, 2A, 2B and 2C include a plurality of string selection driving transistors TR-S for individually driving a plurality of string selection transistors SST, such integrated circuit devices may individually operate the plurality of memory cell strings MS. Accordingly, in order to simultaneously drive at least two of the plurality of erase control transistors ECT, an integrated circuit device may include a common connection wiring line 190X connecting at least two erase control lines ECL and extending in the first horizontal direction, and an extension connection wiring line 190E for connecting the common connection wiring line 190X to the erase control driving transistor TR-G.

With this configuration, it is possible to minimize the number of erase control connection wiring lines including the common connection wiring line 190X and the extension connection wiring line 190E. It is also possible to minimize a layout area required for the connection wiring line 190 and a layout area occupied by the erase control driving transistor TR-G. As a result, the plurality of memory cells MC of the integrated circuit device 1 may be more easily and effectively controlled without a corresponding increase in the layout area occupied by an integrated circuit device according to embodiments of the inventive concept.

Figure 3A:
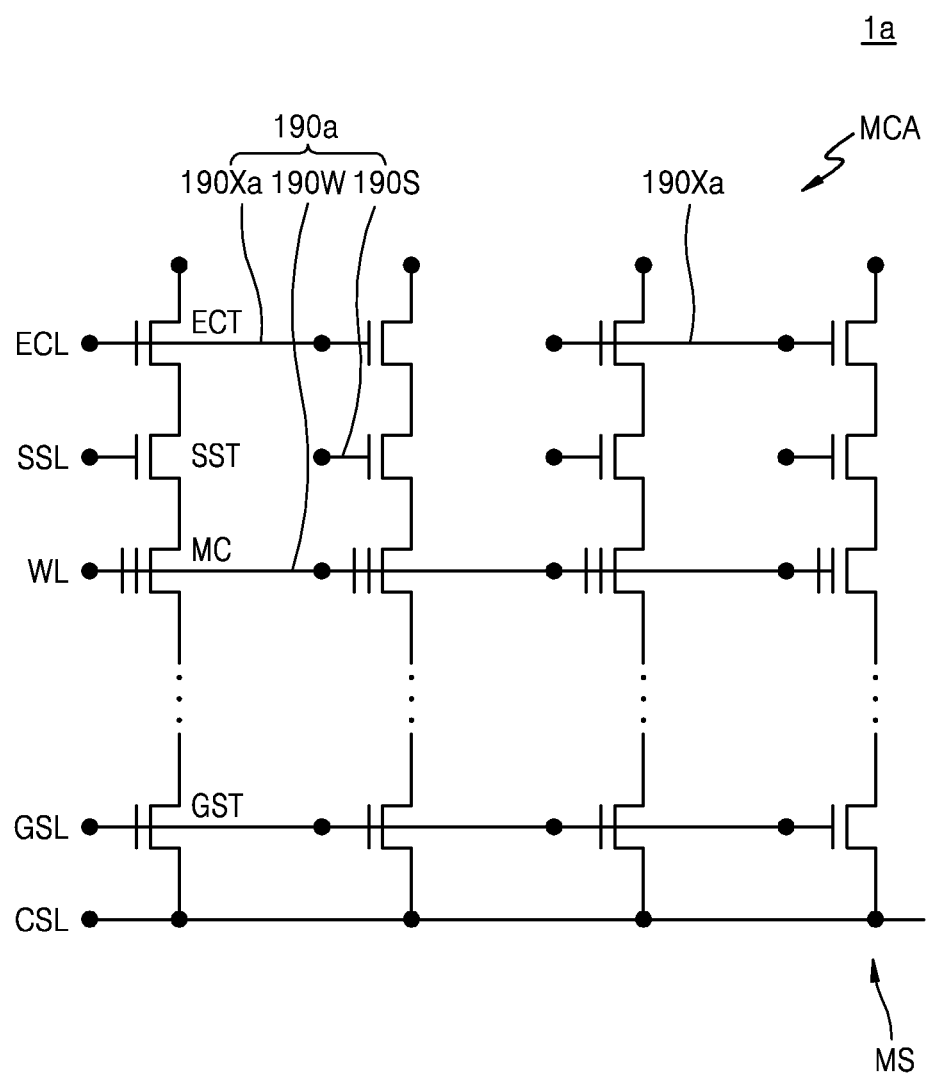
FIG. 3A is an equivalent circuit diagram of a memory cell array of an integrated circuit device according to an embodiment of the inventive concept.
Figure 3B:
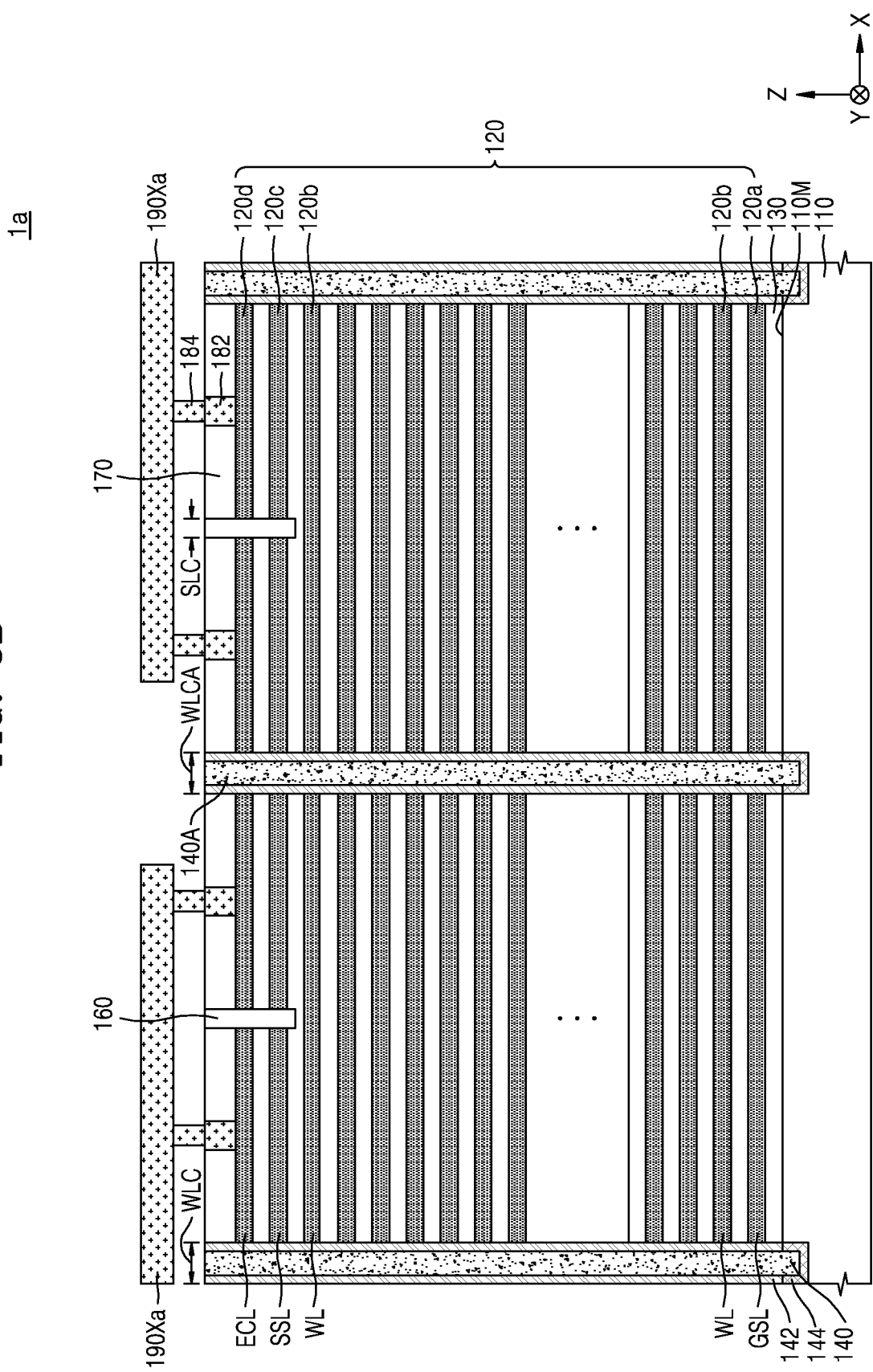
FIG. 3B is a cross-sectional view of an integrated circuit device according to an embodiment of the inventive concept.

FIG. 3A is an equivalent circuit diagram of a memory cell array of an integrated circuit device 1*a* according to embodiments of the inventive concept, and FIG. 3B is a cross-sectional view of the integrated circuit device 1*a* taken along a common connection wiring line 190Xa for connecting the erase control line ECL. Here, the undescribed portions of the integrated circuit device 1*a* may be similar in configuration and operation to the integrated circuit device 1 previously described in relation to FIGS. 1, 2A, 2B and 2C.

Referring to FIGS. 3A and 3B, the integrated circuit device 1*a* may include a plurality of connection wiring lines 190*a*, wherein the plurality of connection wiring lines 190*a* includes the common connection wiring line 190Xa, the extension connection wiring line (refer to 190E of FIG. 1), the string connection wiring line 190S, and the gate connection wiring line 190W. The common connection wiring line 190Xa and the extension connection wiring line 190E may be connected to the erase control line ECL, the string connection wiring line 190X may be connected to the string selection line SSL, and the gate connection wiring line 190W may be connected to the word line WL or the ground selection line CSL. The common connection wiring line 190Xa and the extension connection wiring line 190E may be referred to as the erase control connection wiring lines.

The common connection wiring line 190Xa extending in the first horizontal direction (the direction in which the bit lines BL extend, as shown in of FIG. 1) may be connected to the at least two erase control lines ECL. That is, the common connection wiring line 190Xa extending in the first horizontal direction may be connected to the at least two erase control lines ECL in the erase control connection wiring lines. For example, a plurality of common connection wiring lines 190Xa extending in the first horizontal direction and may be connected the at least two erase control lines ECL among the plurality of erase control lines ECL in one block.

The common connection wiring line 190X previously described in relation to FIGS. 1, 2A, 2B and 2C may be connected to the plurality of erase control lines ECL in one block. However, in FIGS. 3A and 3B, each of the at least two common connection wiring lines 190Xa physically divided in the first horizontal direction may be connected to at least two different erase control lines ECL among the plurality of erase control lines ECL in one block.

In addition, the at least two common connection wiring lines 190Xa physically divided in the first horizontal direction may be respectively connected to at least two erase control driving transistors (see, e.g., component TR-E in FIG. 1).

Figure 4A:
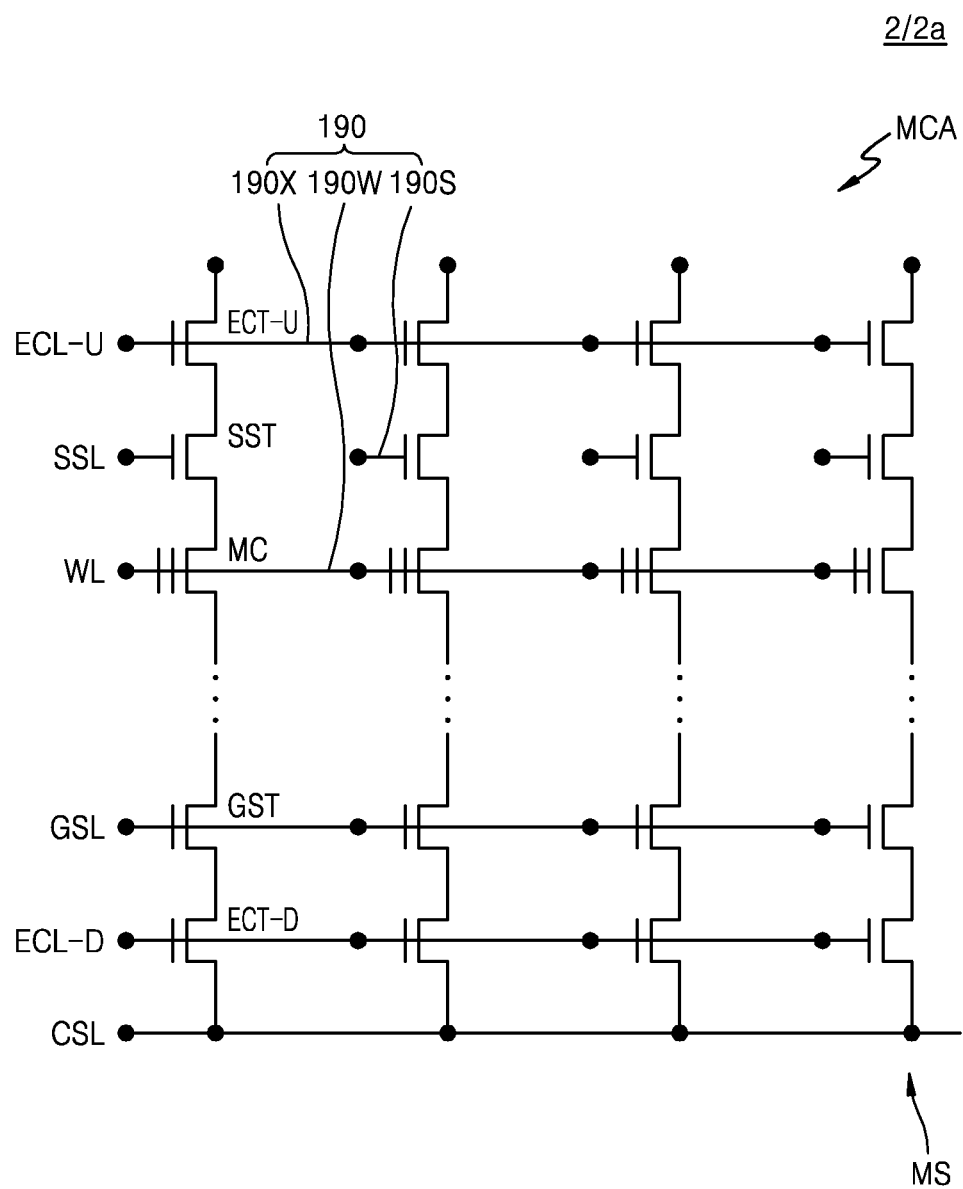
FIG. 4A is an equivalent circuit diagram of a memory cell array of an integrated circuit device according to an embodiment of the inventive concept.
Figure 4B:
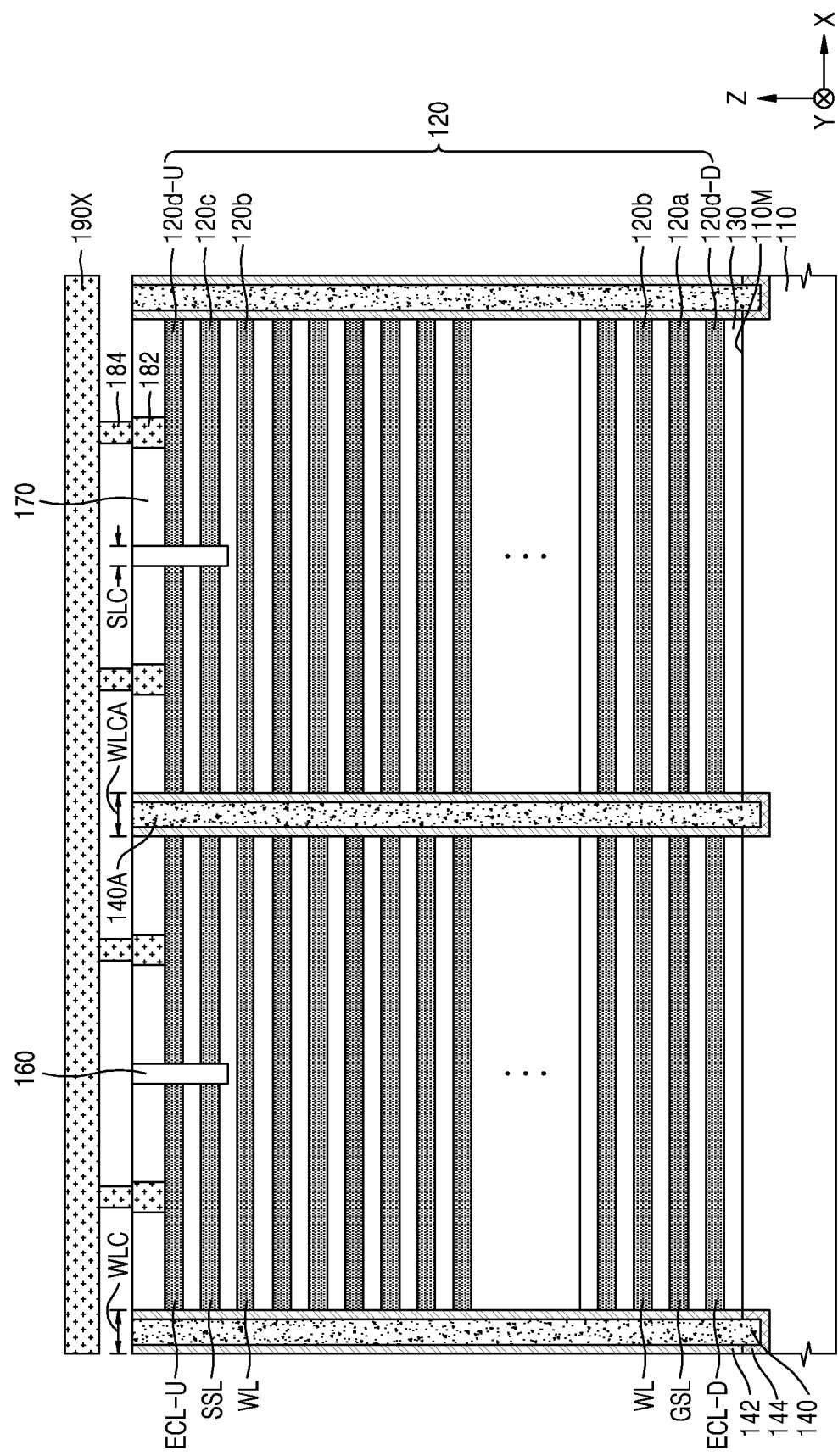
FIGS. 4B and 4C are cross-sectional views of integrated circuit devices according to embodiments of the inventive concept.
Figure 4C:
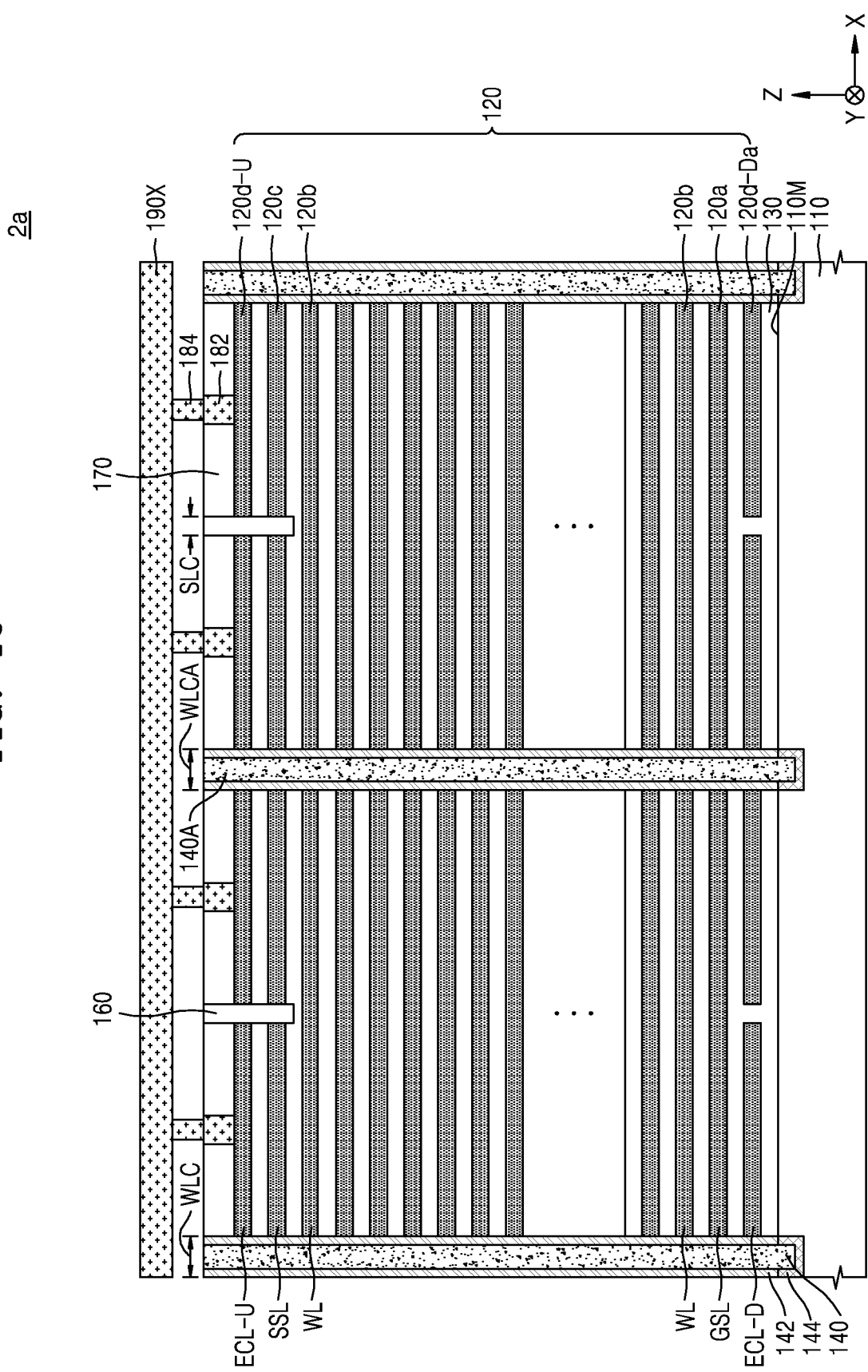

FIG. 4A is an equivalent circuit diagram for a memory cell array of an integrated circuit device 2 or 2a according to embodiments of the inventive concept. FIGS. 4B and 4C are respective cross-sectional views of the integrated circuit devices 2 and 2a taken along the common connection wiring line 190X for connecting the upper erase control electrode ECL-U. Here, the undescribed portions of the integrated circuit devices 2 and 2a may be respectively similar in configuration and operation to one or more of the integrated circuit devices previously described in relation to FIGS. 1 through 3B, inclusive.

Referring to FIGS. 4A, 4B and 4C, each of the integrated circuit devices 2 and 2a may include a plurality of gate electrodes 120. Each of the plurality of memory cell string MS may include a lower erase control transistor ECT-D, a ground selection transistor GST, a plurality of memory cells MC, a string selection transistor SST, and an upper erase control transistor ECT-U that are serially connected to each other. In exemplary embodiments, the plurality of gate electrodes 120 may correspond to at least one lower erase control line ECL-D that configures the memory cell string MS, at least one ground selection line GSL, a plurality of word lines WL, at least one string selection line SSL, and at least one upper erase control line ECL-U. A gate terminal of the upper erase control transistor ECT-U may be connected to the upper erase control line ECL-U and a gate terminal of the lower erase control transistor ECT-D may be connected to the lower erase control line ECL-D. The upper erase control line ECL-U and the upper erase control transistor ECT-U may be the same as the erase control line ECL and the erase control transistor ECT described with reference to FIGS. 1 through 3B.

For example, at least one gate electrode 120d-D or 120d-Da in the lowermost portion functions as the at least one lower erase control line ECL-D, the at least one gate electrode 120a above the at least one gate electrode 120d-D or 120d-Da that functions as the at least one lower erase control line ECL-D functions as the ground selection line GSL, the at least one gate electrode 120d-U in the uppermost portion functions as the upper erase control line ECL-U, the at least one gate electrode 120c below the at least one gate electrode 120d-U in the uppermost portion, which functions as the upper erase control line ECL-U, functions as the string selection line SSL, and the plurality of remaining gate electrodes 120b may function as the word lines WL.

Each of the at least two gate electrodes 120c and 120d-U in the uppermost portion may be divided into at least two lines by the string isolation insulating layer 160 on a plane. For example, between the word line cut region WLC and the intermediate word line cut region WLCA or between the pair of word line cut regions WLC, the string selection line cut region SLC may extend in the second horizontal direction and the string isolation insulating layer 160 may be disposed in the string selection line cut region SLC. Therefore, each of the upper erase control line ECL-U and the string selection line SSL may have a lesser width than that of the word line WL in the first horizontal direction. The width of each of the upper erase control line ECL-U and the string selection line SSL in the first horizontal direction may be less than ½ of the width of the word line WL in the first horizontal direction. For example, in the width of the one word line WL in the first horizontal direction, the two physically divided upper erase control lines ECL-U and the two physically divided string selection lines SSL may be disposed.

Referring to FIG. 4B, the at least one gate electrode 120d-D in the lowermost portion of the integrated circuit device 2 may have the same width as that of the at least two gate electrodes 120a and 120b above the at least one gate electrode 120d-D in the lowermost portion. For example, in the width of the one word line WL in the first horizontal direction, the one physically divided lower erase control line ECL-D may be disposed.

However, when the word line cut region WLC and/or the intermediate word line cut region WLCA extend toward the substrate 110 and the width thereof in the first horizontal direction is gradually reduced and accordingly, the word line cut region WLC and/or the intermediate word line cut region WLCA are tapered, a width of the lower erase control line ECL-D in the first horizontal direction may be slightly greater than that of the width of the word line WL in the first horizontal direction.

Referring to FIG. 4C, the at least one gate electrode 120d-Da in the lowermost portion of the integrated circuit device 2a may be divided into at least two lines on a plane. The lower erase control line ECL-D may have a lesser width than that of the word line WL in the first horizontal direction. The width of the lower erase control line ECL-D in the first horizontal direction may be less than ½ of the width of the word line WL in the first horizontal direction. For example, in the width of the one word line WL in the first horizontal direction, the two physically divided lower erase control lines ECL-D may be disposed.

Referring to FIGS. 4A, 4B and 4C, the common connection wiring line 190X extending in the first horizontal direction may be connected to a plurality of upper erase control lines ECL-U in one block. The plurality of lower erase control lines ECL-D in the one block may be connected. In some embodiments, the plurality of lower erase control lines ECL-D in the one block may be connected to the common connection wiring line 190X for connecting the plurality of upper erase control lines ECL-U in the one block by a similar connection wiring line. In other embodiments, the plurality of lower erase control lines ECL-D in the one block may be connected by a conductive region formed in the substrate 110.

The number of connected upper erase control transistors ECT-U may equal to the number of connected lower erase control transistors ECT-D.

For example, the integrated circuit device 2 illustrated in FIG. 4B is connected to four physically divided upper erase control lines ECL-U in a horizontal direction and may be connected to the two physically divided lower erase control lines ECL-D in the horizontal direction. The number of lower erase control transistors ECT-D connected to the one physically divided lower erase control line ECL-D may be twice the number of upper erase control transistors ECT-U connected to one physically divided upper erase control line ECL-U.

For example, the integrated circuit device 2a illustrated in FIG. 4C is connected to the four physically divided upper erase control lines ECL-U in the horizontal direction and may be connected to four physically divided lower erase control lines ECL-D in the horizontal direction. The number of lower erase control transistors ECT-D connected to the one physically divided lower erase control line ECL-D may equal to the number of upper erase control transistors ECT-U connected to one physically divided upper erase control line ECL-U.

Figure 5:
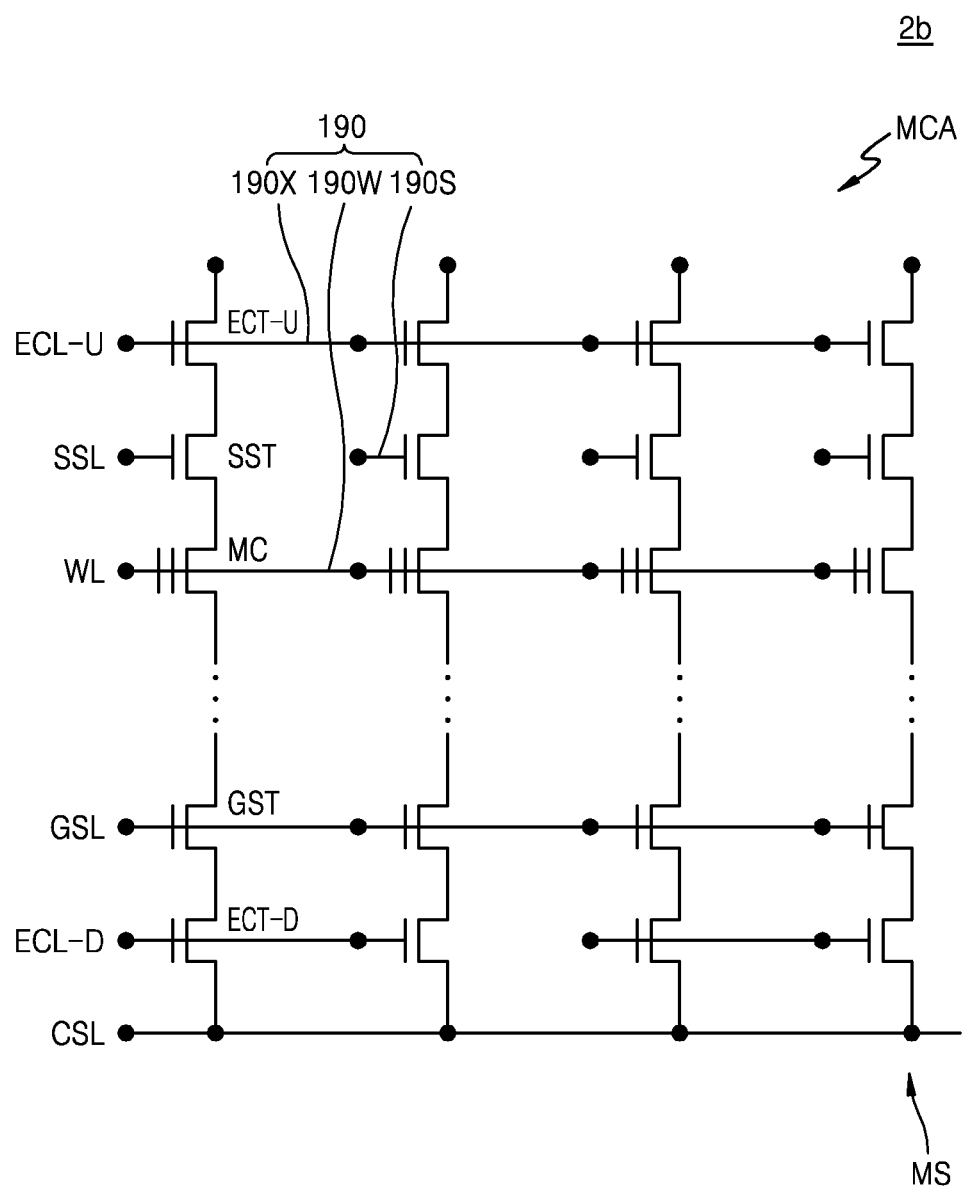
FIGS. 5, 6 and 7 are respective equivalent circuit diagrams of memory cell arrays of integrated circuit devices according to embodiments of the inventive concept.
Figure 6:
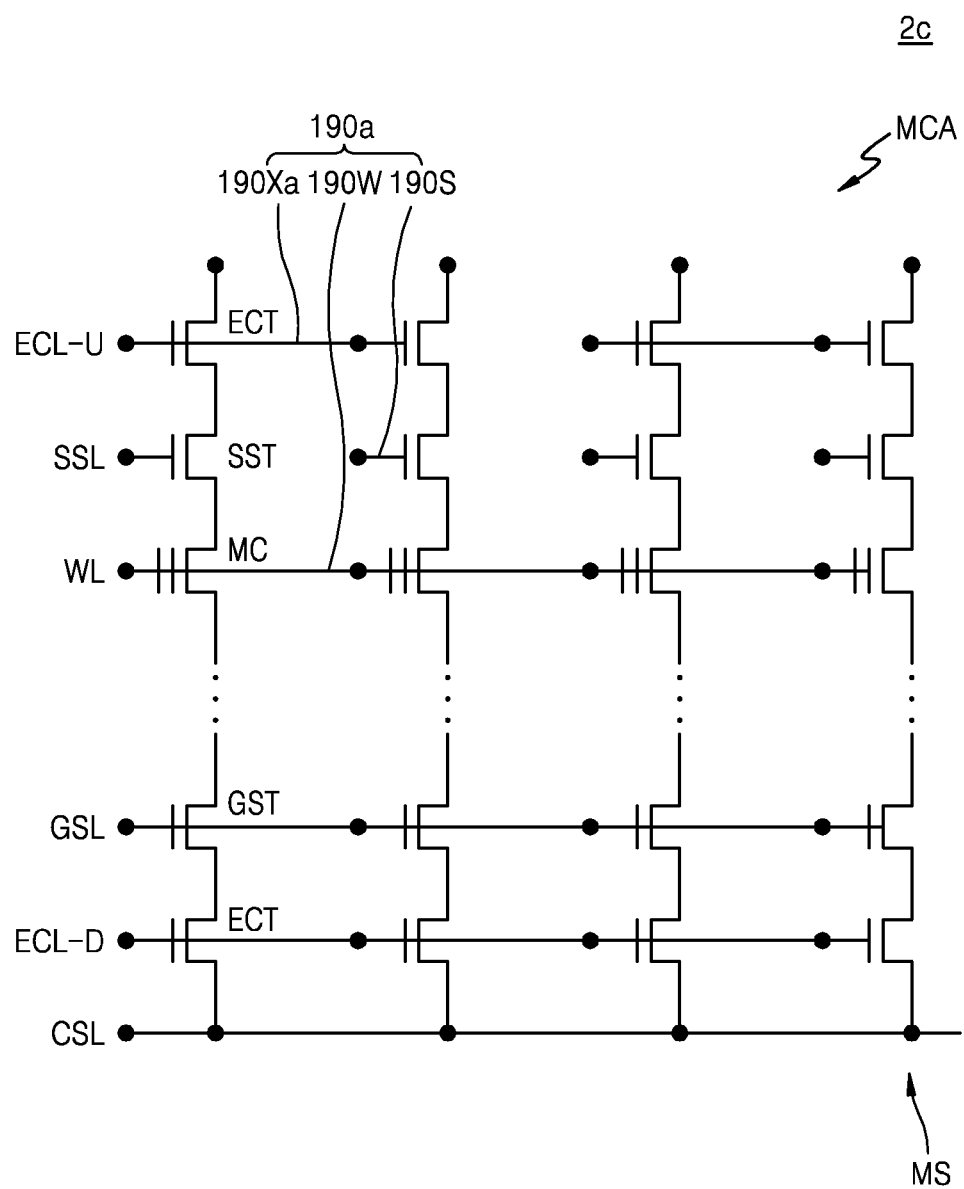
Figure 7:
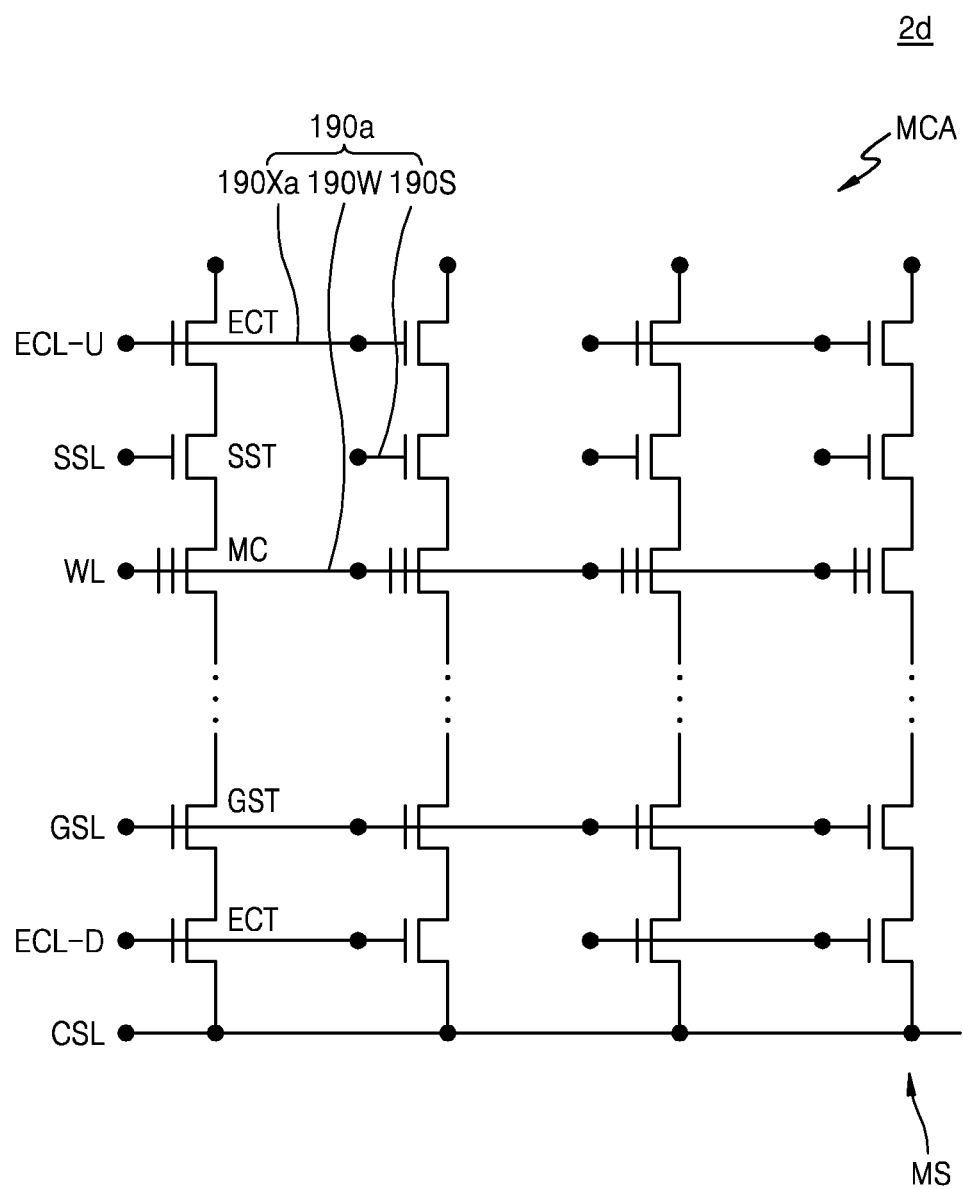

FIGS. 5, 6 and 7 are corresponding equivalent circuit diagrams for memory cell arrays for integrated circuit devices 2b, 2c, and 2d according to embodiments of the inventive concept.

Referring to FIG. 5, in the integrated circuit device 2b, the number of connected upper erase control transistors ECT-U may be greater than the number of connected lower erase control transistors ECT-D. For example, the number of connected upper erase control transistors ECT-U may be twice or no less than twice the number of connected lower erase control transistors ECT-D.

For example, the upper erase control line ECL-U in one block of the integrated circuit device 2b illustrated in FIG. 5 is physically divided into four in the horizontal direction like the upper erase control line ECL-U of each of the integrated circuit devices 2 and 2a illustrated in FIGS. 4A and 4B and the four physically divided upper erase control lines ECL-U may be connected. For example, the lower erase control line ECL-D in the one block of the integrated circuit device 2b illustrated in FIG. 5 is physically divided into two in the horizontal direction like the lower erase control line ECL-D of the integrated circuit device 2 of FIG. 4A and the two physically divided lower erase control lines ECL-D are connected or the lower erase control line ECL-D in the one block of the integrated circuit device 2b illustrated in FIG. 5 is physically divided into four in the horizontal direction like the lower erase control line ECL-D of the integrated circuit device 2a illustrated in FIG. 4B and the four physically divided lower erase control lines ECL-D may be connected.

Referring to FIG. 6, in the integrated circuit device 2c, the number of connected upper erase control transistors ECT-U may be less than the number of connected lower erase control transistors ECT-D. For example, the number of connected lower erase control transistors ECT-D may be twice or no less than twice the number of connected upper erase control transistors ECT-U.

For example, the upper erase control line ECL-U in one block of the integrated circuit device 2c illustrated in FIG. 6 is physically divided into four in the horizontal direction like the upper erase control line ECL-U of the integrated circuit device 1a illustrated in FIGS. 3A and 3B and the four physically divided upper erase control lines ECL-U may be connected by twos.

For example, the lower erase control line ECL-D in the one block of the integrated circuit device 2c illustrated in FIG. 6 is physically divided into two in the horizontal direction like the lower erase control line ECL-D of the integrated circuit device 2 illustrated in FIG. 4A and the two physically divided lower erase control lines ECL-D may be connected or the lower erase control line ECL-D in the one block of the integrated circuit device 2c illustrated in FIG. 6 is physically divided into four in the horizontal direction like the lower erase control line ECL-D of the integrated circuit device 2a illustrated in FIG. 4B and the four physically divided lower erase control lines ECL-D may be connected by twos.

Referring to FIG. 7, in the integrated circuit device 2d, the number of connected upper erase control transistors ECT-U may equal to the number of connected lower erase control transistors ECT-D.

For example, the upper erase control line ECL-U in one block of the integrated circuit device 2d illustrated in FIG. 7 is physically divided into four in the horizontal direction like the upper erase control line ECL-U of the integrated circuit device 1a illustrated in FIGS. 3A and 3B and the four physically divided upper erase control lines ECL-U may be connected by twos.

For example, the lower erase control line ECL-D in one block of the integrated circuit device 2d illustrated in FIG. 7 is physically divided into two in the horizontal direction like the lower erase control line ECL-D of the integrated circuit device 2 illustrated in FIG. 4A and the two physically divided lower erase control lines ECL-D are not connected or the lower erase control line ECL-D in one block of the integrated circuit device 2d illustrated in FIG. 7 is physically divided into four in the horizontal direction like the lower erase control line ECL-D of the integrated circuit device 2a illustrated in FIG. 4B and the four physically divided lower erase control lines ECL-D may be connected by twos.

Figure 8:
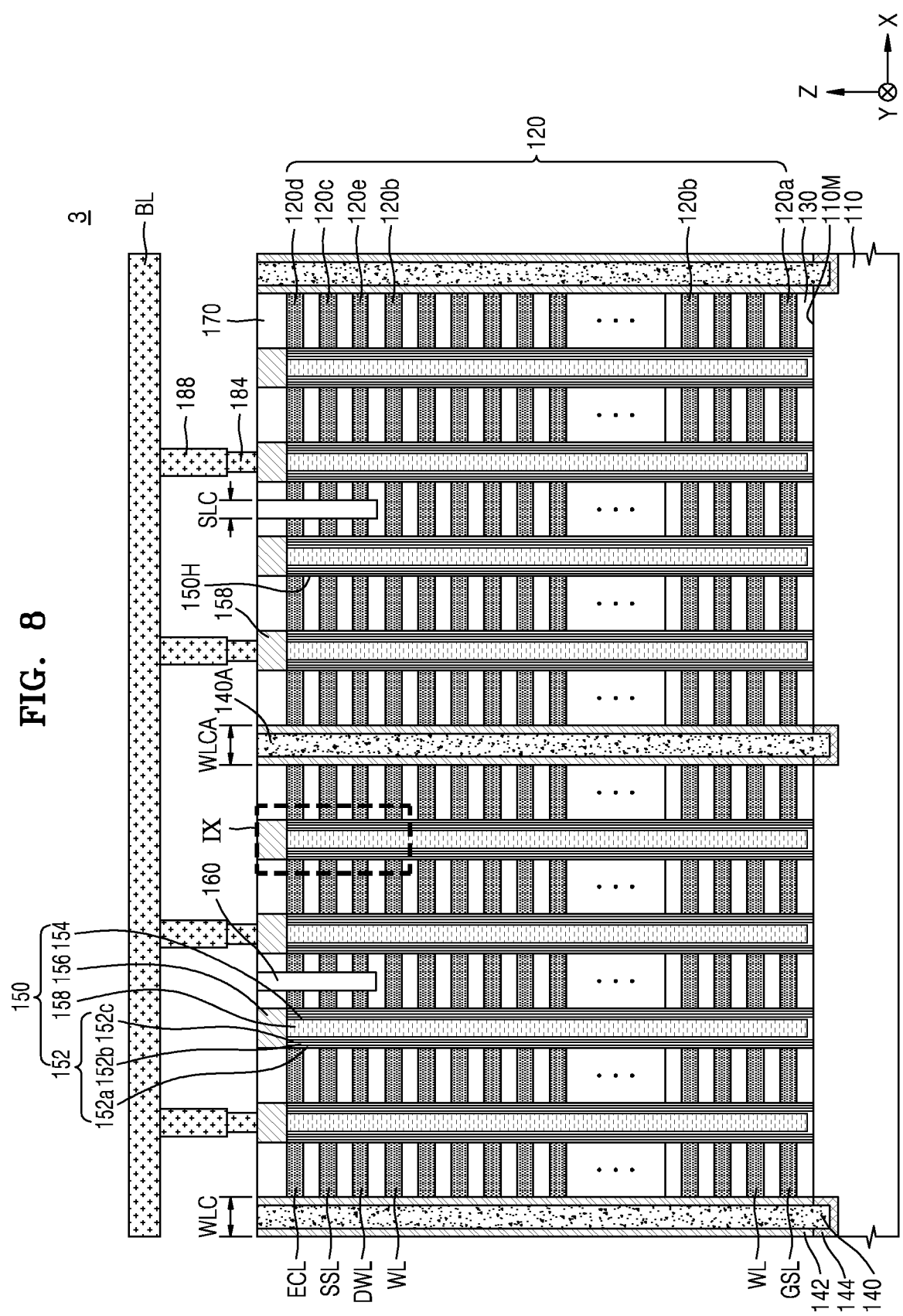
FIG. 8 is a cross-sectional view of an integrated circuit device according to an embodiment of the inventive concept.

FIG. 8 is a cross-sectional view of an integrated circuit device 3 according to embodiments of the inventive concept taken along the bit line BL. Here, the undescribed portions of the integrated circuit device 3 may be similar in configuration and operation to one or more of the integrated circuit devices previously described in relation to FIGS. 1 through 7, inclusive.

Referring to FIG. 8, the integrated circuit device 3 may include the plurality of gate electrodes 120. The at least one gate electrode 120a in the lowermost portion functions as the ground selection line GSL, the at least one gate electrode 120d in the uppermost portion functions as the erase control line ECL, the at least one gate electrode 120c below the at least one gate electrode 120d in the uppermost portion, which functions as the erase control line ECL, functions as the string selection line SSL, at least one gate electrode 120e below the at least one gate electrode 120c in the uppermost portion, which functions as the string selection line SSL, may be a dummy word line DWL, and the plurality of remaining gate electrodes 120b may function as the word lines WL.

In this regard, the dummy word line DWL may be disposed between the string selection line SSL and the word line WL to reduce electrical interference between the string selection line SSL and the word line WL. Alternately or additionally, a dummy word line DWL may be disposed between the string selection line SSL and the erase control line ECL (e.g., the uppermost portion among the plurality of gate electrodes 120).

FIGS. 9A, 9B, 9C, 9D and 9E are respective cross-sectional views taken along the dashed line region IX of the integrated circuit device 3 shown in FIG. 8.

Figure 9A:
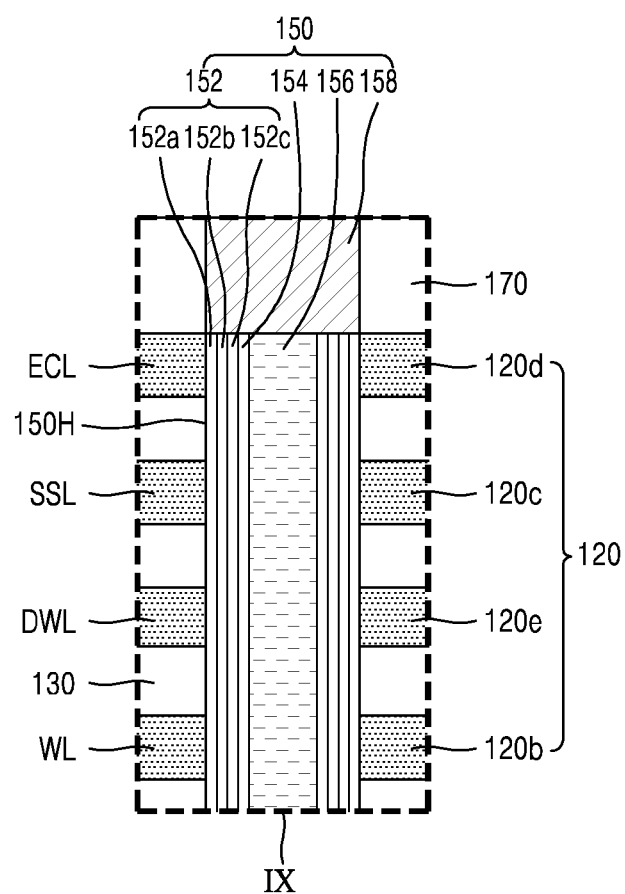
FIGS. 9A, 9B, 9C, 9D and 9E are respective cross-sectional views of the dashed line region IX of the integrated circuit device shown in FIG. 8.

Referring to FIG. 9A, the channel structure 150 may be disposed in the channel hole 150H. The gate insulating layer 152 and the channel layer 154 may be sequentially disposed on the inner wall of the channel hole 150H such that the buried insulating layer 156 fills the residual space of the channel hole 150H. The conductive plug 158 that contacts the channel layer 154 and covers the entrance of the channel hole 150H may be disposed on the channel hole 150H.

The gate insulating layer 152 may include the blocking dielectric layer 152a, the charge storage layer 152b, and the tunnelling dielectric layer 152c sequentially formed on the gate electrode 120 toward the channel layer 154.

The uppermost end of the gate insulating layer 152 may be disposed at the same level as that of an upper surface of the gate electrode 120d in the uppermost portion among the plurality of gate electrodes 120. The uppermost end of the gate insulating layer 152 and the uppermost end of the channel layer 154 may be disposed at the same level. The lowermost end of the conductive plug 158 may be disposed at the same level as or at a lower level than that of the upper surface of the gate electrode 120d in the uppermost portion among the plurality of gate electrodes 120.

Figure 9B:
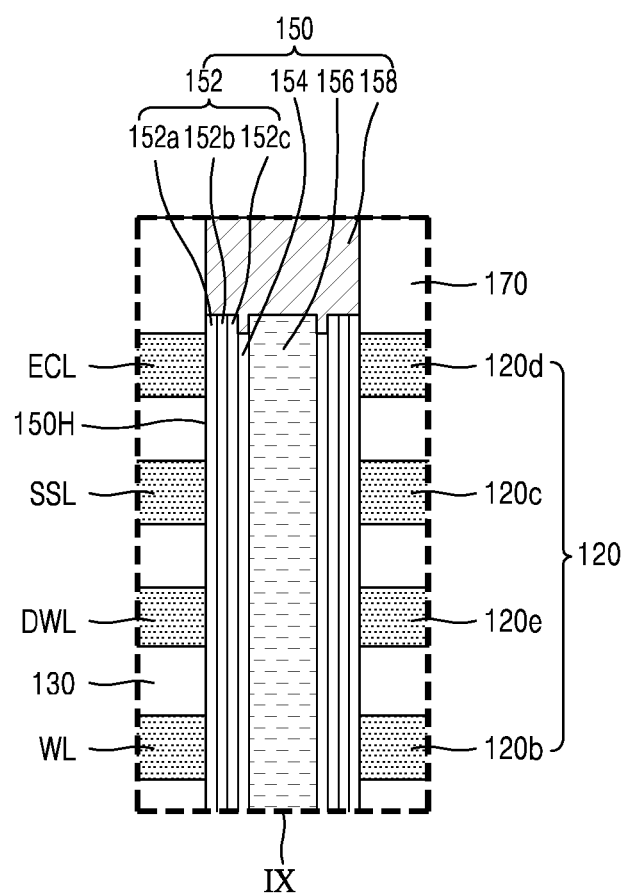

Referring to FIG. 9B, the uppermost end of the gate insulating layer 152 may be disposed at a higher level than that of the upper surface of the gate electrode 120d in the uppermost portion among the plurality of gate electrodes 120. The uppermost end of the channel layer 154 may be disposed at a lower level than that of the uppermost end of the gate insulating layer 152. The lowermost end of the conductive plug 158 may be disposed at the same level as or at a lower level than that of the upper surface of the gate electrode 120d in the uppermost portion among the plurality of gate electrodes 120.

Figure 9C:
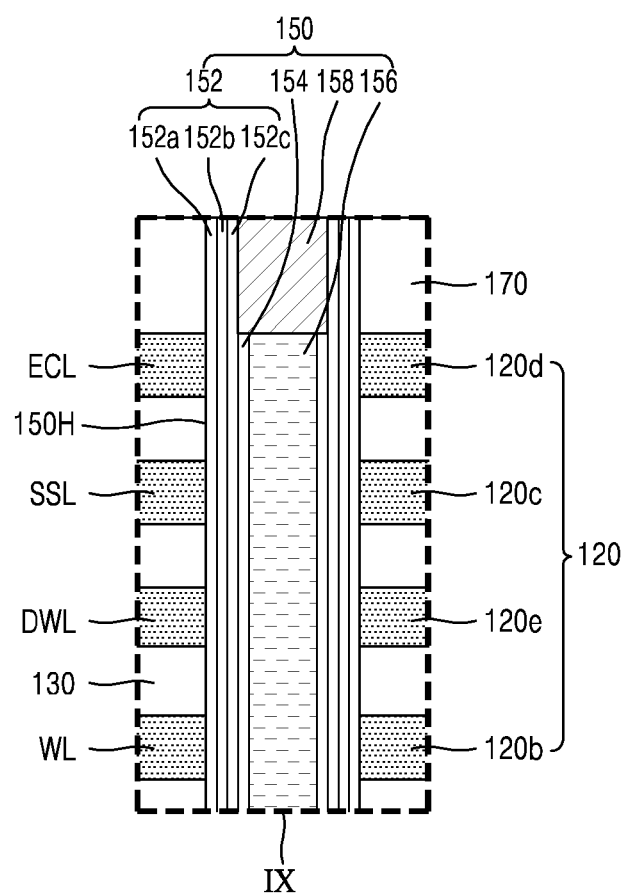

Referring to FIG. 9C, the uppermost end of the gate insulating layer 152 may be disposed at a higher level than that of the upper surface of the gate electrode 120d in the uppermost portion among the plurality of gate electrodes 120. The lowermost end of the conductive plug 158 may be disposed at the same level as or at a lower level than that of the upper surface of the gate electrode 120d in the uppermost portion among the plurality of gate electrodes 120.

Figure 9D:
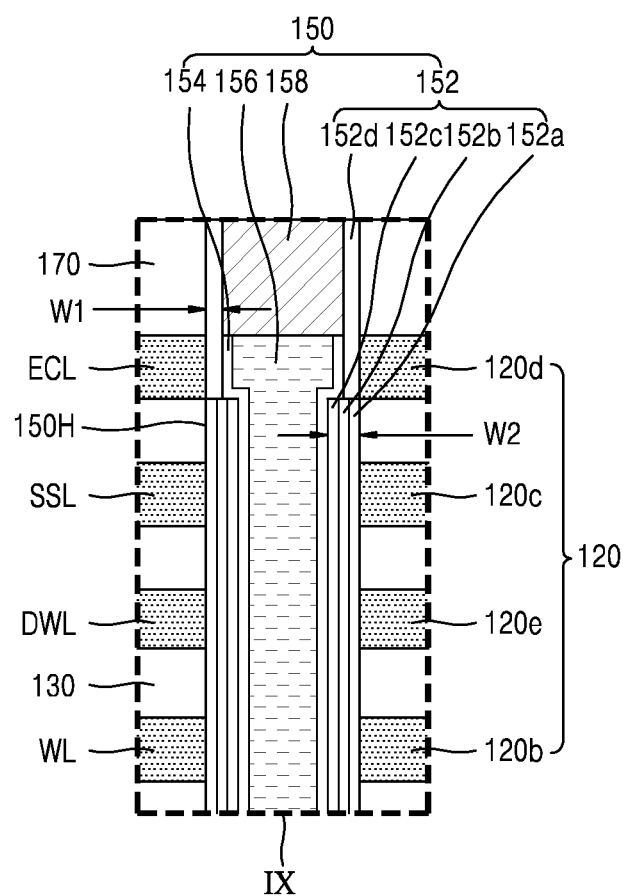

Referring to FIG. 9D, the gate insulating layer 152 may include the blocking dielectric layer 152a, the charge storage layer 152b, the tunnelling dielectric layer 152c, and the gate dielectric layer 152d.

The uppermost end of each of the blocking dielectric layer 152a, the charge storage layer 152b, and the tunnelling dielectric layer 152c may be disposed at a level between a level of a lower surface of the gate electrode 120d in the uppermost portion and a level of an upper surface of the gate electrode 120c in the uppermost portion among the plurality of gate electrodes 120. The gate dielectric layer 152d may face a side surface of the gate electrode 120d in the uppermost portion among the plurality of gate electrodes 120. The thickness of the gate dielectric layer 152d that faces the side surface of the gate electrode 120d in the uppermost portion may be less than that of a second width W2 that is the sum of widths for the blocking dielectric layer 152a, the charge storage layer 152b, and the tunnelling dielectric layer 152c in the horizontal direction.

That is, among the plurality of gate electrodes 120, a first width W1 that is a thickness of the gate insulating layer 152 facing the side surface of the gate electrode 120d in the uppermost portion (e.g., the erase control line ECL), may be less than that of a second width W2 that is a thickness of the gate insulating layer 152 facing side surfaces of the remaining gate electrodes 120 (e.g., the string selection line SSL), the dummy word line DWL, and the word line WL.

Figure 9E:
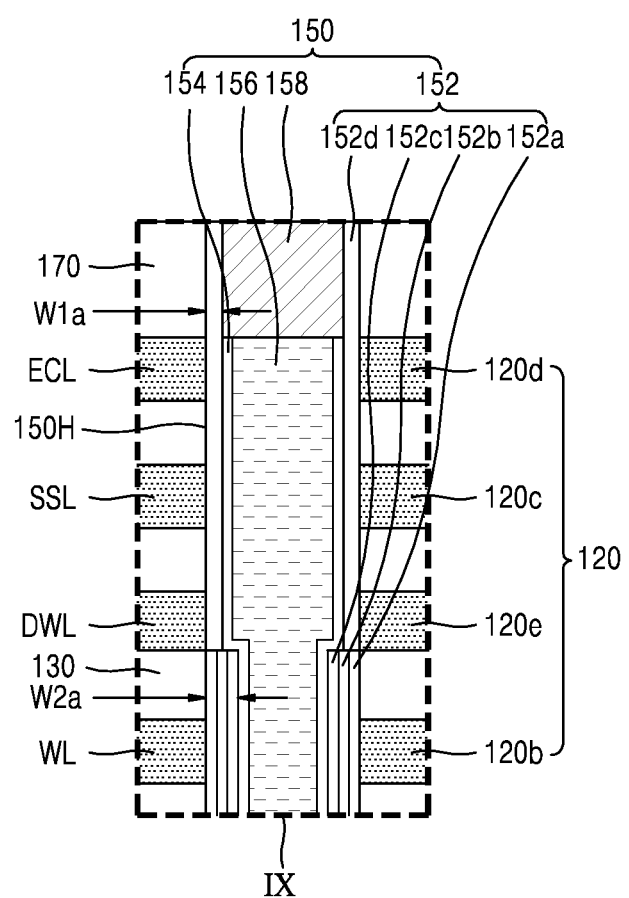

Referring to FIG. 9E, the gate insulating layer 152 may include the blocking dielectric layer 152a, the charge storage layer 152b, the tunnelling dielectric layer 152c, and the gate dielectric layer 152d.

The uppermost end of each of the blocking dielectric layer 152a, the charge storage layer 152b, and the tunnelling dielectric layer 152c may be disposed at a level between a level of an upper surface of the word line WL and a level of a lower surface of the dummy gate line DWL in the uppermost portion among the plurality of gate electrodes 120. The gate dielectric layer 152d may face side surfaces of the erase control line ECL, the string selection line SSL, and the dummy word line DWL among the plurality of gate electrodes 120. A first width W1a of the gate dielectric layer 152d in the horizontal direction, that is, the thickness of the gate dielectric layer 152d that faces the side surfaces of the erase control line ECL, the string selection line SSL, and the dummy word line DWL, may be less than a second width W2a that is the sum of the widths of the blocking dielectric layer 152a, the charge storage layer 152b, and the tunnelling dielectric layer 152c in the horizontal direction.

In some embodiments, the uppermost end of each of the blocking dielectric layer 152a, the charge storage layer 152b, and the tunnelling dielectric layer 152c may be disposed at a level between a level of an upper surface of the dummy gate line DWL and a level of a lower surface of the string selection line SSL. That is, the gate dielectric layer 152d faces the side surfaces of the erase control line ECL and the string selection line SSL and the blocking dielectric layer 152a, the charge storage layer 152b, and the tunnelling dielectric layer 152c may face the side surfaces of the word line WL and the dummy word line DWL.

In each of FIGS. 9A, 9B, 9C, 9D and 9E (hereafter, 9A through 9E, inclusive), one erase control line ECL, one string selection line SSL, and one dummy word line DWL are respectively illustrated. However, the scope of the inventive concept is not limited thereto. At least one of the erase control line ECL, the string selection line SSL, and the dummy word line DWL may include multiple lines. In this case, an upper surface, a lower surface, and a side surface of the erase control line ECL illustrated in FIGS. 9A through 9E respectively, may define an upper surface of the erase control line ECL in the uppermost side, a lower surface of the erase control line ECL in the lowermost side, and side surfaces of the plurality of erase control lines ECL among the plurality of erase control lines ECL. An upper surface, a lower surface, and a side surface of the string selection line SSL may respectively define an upper surface of the string selection line SSL in the uppermost side, a lower surface of the string selection line SSL in the lowermost side, and side surfaces of the plurality of string selection lines SSL among the plurality of string selection lines SSL. An upper surface, a lower surface, and a side surface of the dummy word line DWL may respectively define an upper surface of the dummy word line DWL in the uppermost side, a lower surface of the dummy word line DWL in the lowermost side, and side surfaces of the plurality of dummy word lines DWL among the plurality of dummy word lines DWL.

Figure 10A:
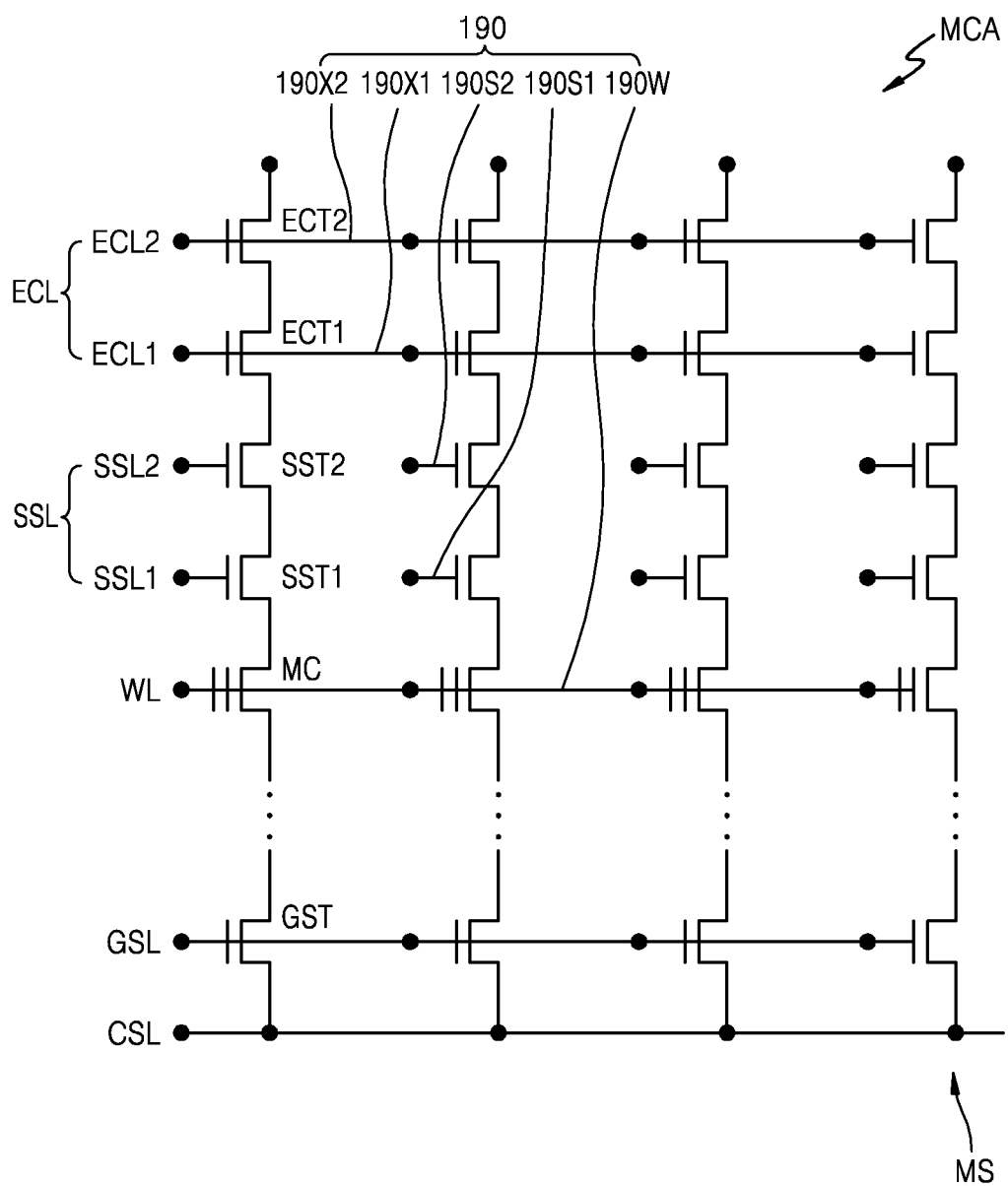
FIG. 10A is an equivalent circuit diagram of a memory cell array of an integrated circuit device according to an embodiment of the inventive concept.
Figure 10B:
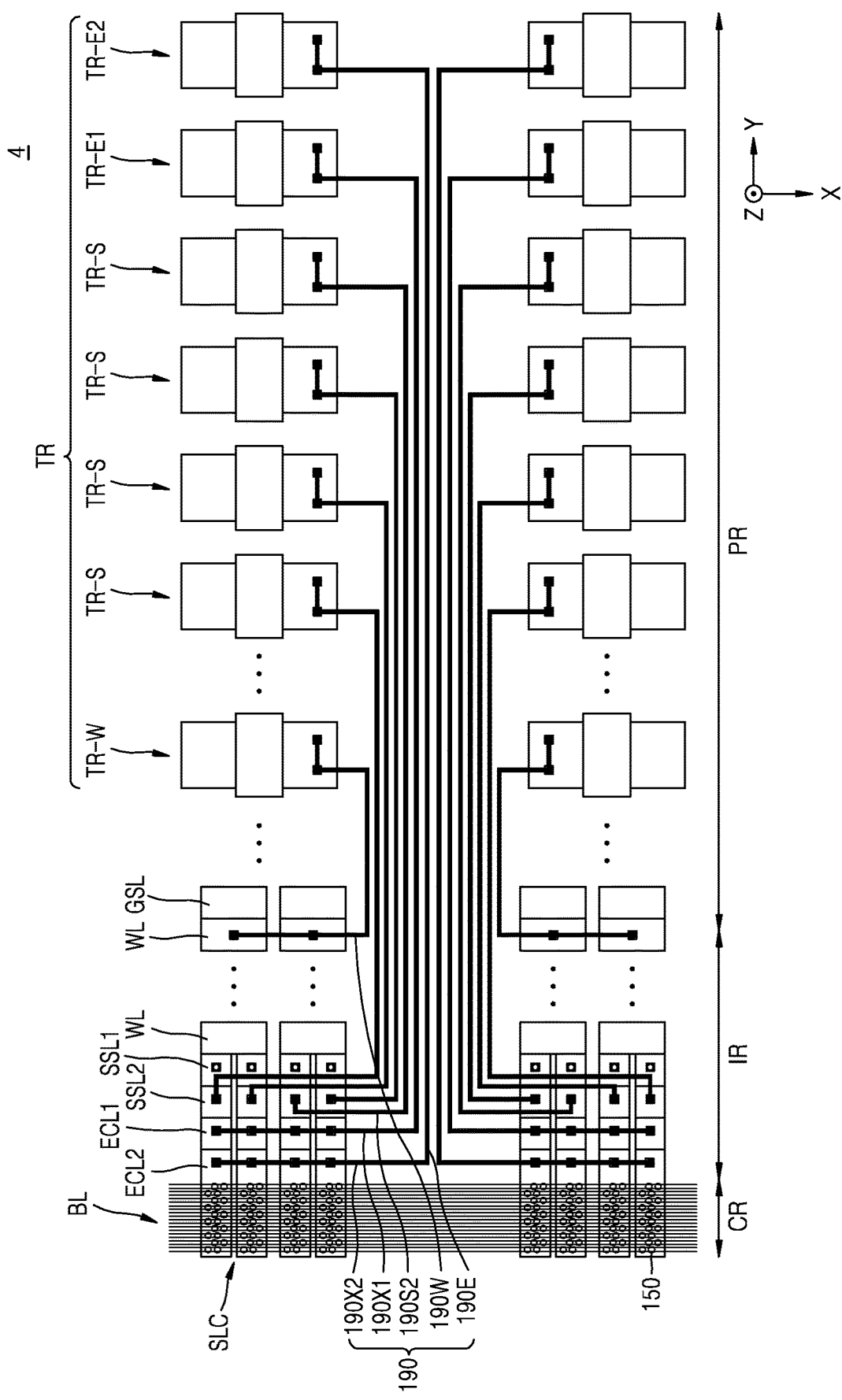
FIG. 10B is a plan view illustrating main components of an integrated circuit device according to an embodiment of the inventive concept.
Figure 10C:
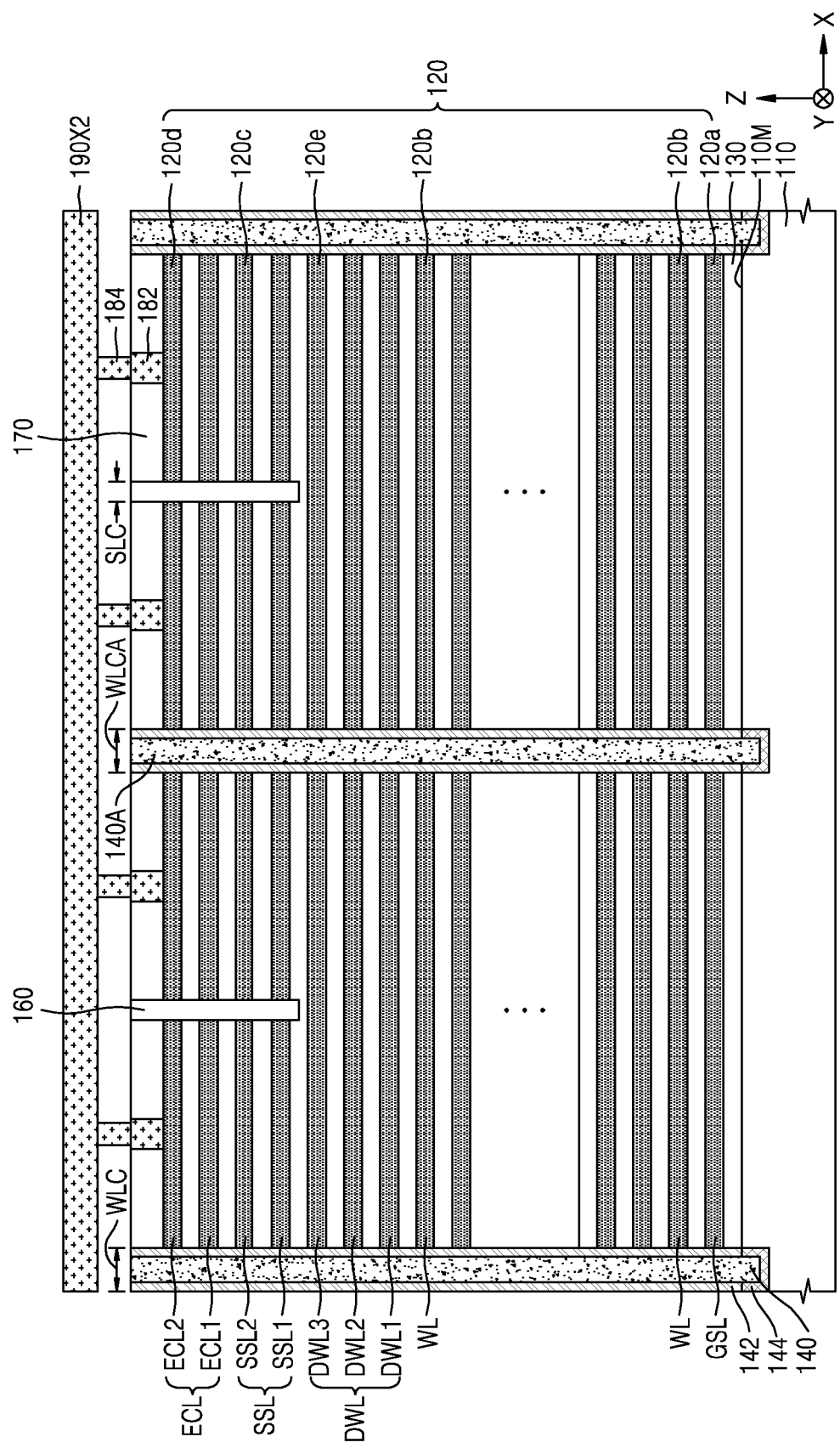
FIG. 10C is a cross-sectional view of an integrated circuit device according to an embodiment of the inventive concept.

FIG. 10A is an equivalent circuit diagram for a memory cell array of an integrated circuit device 4 according an embodiments of the inventive concept. FIG. 10B is a plan view further illustrating the integrated circuit device 4, and FIG. 10C is a cross-sectional view of the integrated circuit device 4 taken along a second common connection wiring line 190X2 for connecting a second erase control electrode ECL2. Here, the undescribed portions of the integrated circuit device 3 may be similar in configuration and operation to one or more of the integrated circuit devices previously described in relation to FIGS. 1 through 9E, inclusive.

Referring to FIGS. 10A, 10B and 10C, the integrated circuit device 4 includes at least two erase control lines ECL, at least one string selection line SSL, at least one dummy word line DWL, a plurality of word lines WL, and at least one ground selection line GSL. However, the integrated circuit device 4 may include at least two string selection lines SSL, and in some embodiments, the integrated circuit device 4 may include at least two dummy word lines DWL.

The at least two erase control lines ECL may be at least two gate electrodes 120d in the uppermost end among the plurality of gate electrodes 120. For example, the at least two erase control lines ECL may include a first erase control line ECL1 that is the gate electrode 120d in the second uppermost end and the second erase control line ECL2 that is the gate electrode 120d in the uppermost end among the plurality of gate electrodes 120. Among the plurality of gate electrodes 120, the first erase control line ECL1 that is the gate electrode 120d in the second uppermost end may extend further from the memory cell region CR in the second horizontal direction than the second erase control line ECL2 that is the gate electrode 120d in the uppermost end. That is, an end of the first erase control line ECL1 that faces the peripheral circuit region PR may extend further from the memory cell region CR to the outside than an end of the second erase control line ECL2.

The plurality of connection wiring lines 190 may include a first common connection wiring line 190X1, the second common connection wiring line 190X2, a first string connection wiring line 190S1, a second string connection wiring line 190S2, and the gate connection wiring line 190W.

The first common connection wiring line 190X1 and the second common connection wiring line 190X2 may be respectively connected to the first erase control line ECL1 and the second erase control line ECL2. The first string connection wiring line 190S1 and the second string connection wiring line 190S2 may be respectively connected to a first string selection line SSL1 and a second string selection line SSL2. The gate connection wiring line 190W may be connected to the word line WL or the ground selection line GSL.

In FIG. 10B, the first string connection wiring line 190S1 connected to the first string selection line SSL1 is not illustrated. However, as will be apparent to those skilled in the art, the first string connection wiring line 190S1 may connect the second string selection line SSL2 and the string selection driving transistor TR-S like the second string connection wiring line 190S2 or shares the second string connection wiring line 190S2 connected to the second string selection line SSL2 that overlaps in the vertical direction and may be connected to the string selection driving transistor TR-S.

The number of first erase control transistors ECT1 connected by the first common connection wiring line 190X1 may be equal to the number of second erase control transistors ECT2 connected by the second common connection wiring line 190X2. For example, the first common connection wiring line 190X1 and the second common connection wiring line 190X2 extend in the first horizontal direction and may be connected to the plurality of first erase control lines ECL1 and the plurality of second erase control lines ECL2 in one block.

The number of first erase control transistors ECT1 and second erase control transistors ECT2 that may be connected to the first common connection wiring line 190X1 and the second common connection wiring line 190X2 may be greater than the number of first string selection transistors SST1 and second string selection transistors SST2 that are connected by the first string selection line SSL1 and the second string selection line SSL2.

Figure 11:
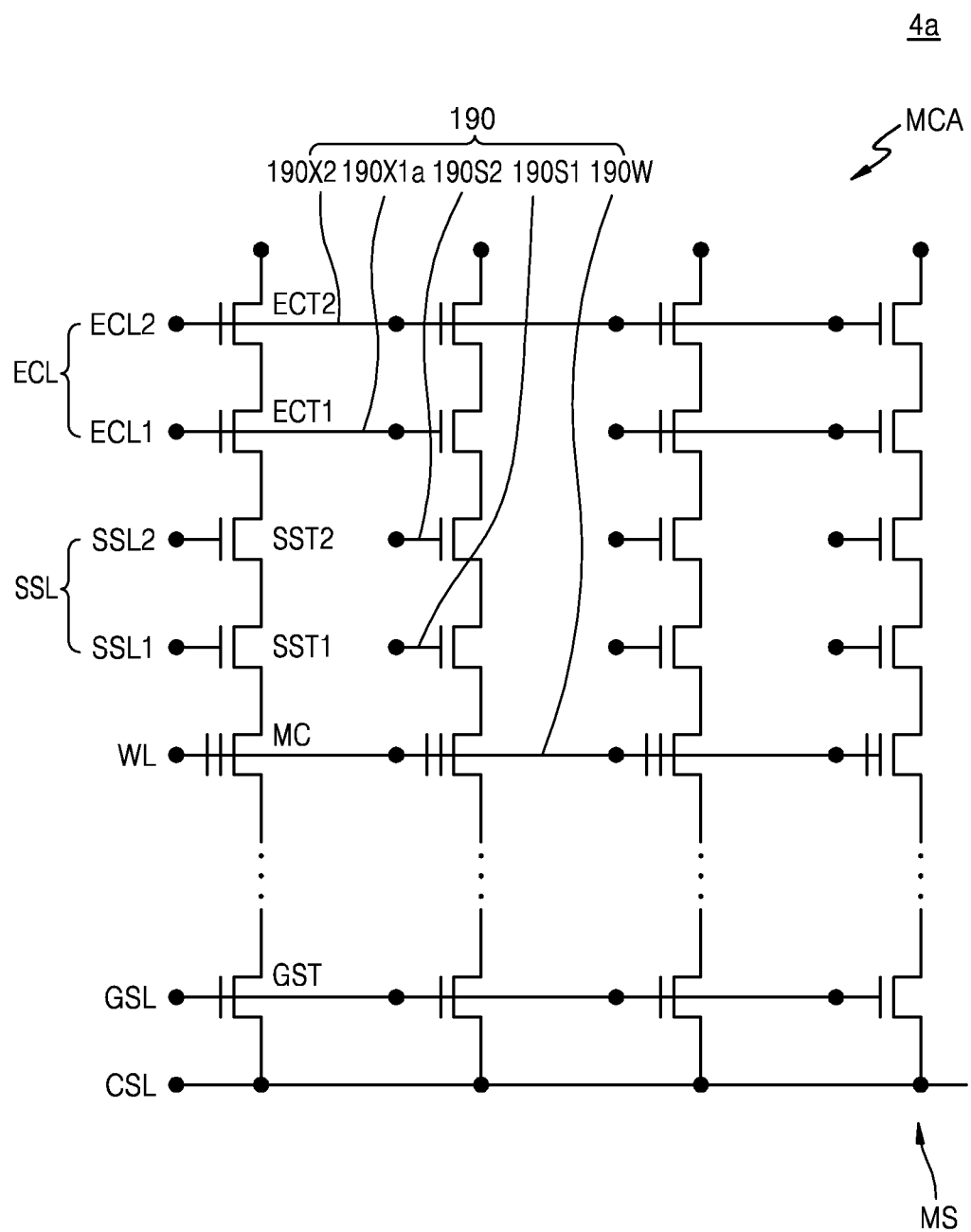
FIG. 11 is an equivalent circuit diagram of a memory cell array of an integrated circuit device according to an embodiment of the inventive concept.

FIG. 11 is an equivalent circuit diagram for a memory cell array of an integrated circuit device 4a according to embodiments of the inventive concept. Here, the undescribed portions of the integrated circuit device 4a may be similar in configuration and operation to one or more of the integrated circuit devices previously described in relation to FIGS. 1 through 10C, inclusive.

Referring to FIG. 11, the integrated circuit device 4a includes at least two erase control lines ECL, at least one string selection line SSL, a plurality of word lines WL, and at least one ground selection line GSL. In some embodiments, the integrated circuit device 4a may include at least two string lines SSL.

The at least two erase control lines ECL may be at least two gate electrodes 120d in the uppermost end among the plurality of gate electrodes 120. For example, the at least two erase control lines ECL may include the first erase control line ECL1 that is the gate electrode 120d in the second uppermost end and the second erase control line ECL2 that is the gate electrode 120d in the uppermost end among the plurality of gate electrodes 120.

The plurality of connection wiring lines 190 may include a first common connection wiring line 190X1a, the second common connection wiring line 190X2, the first string connection wiring line 190S1, the second string connection wiring line 190S2, and the gate connection wiring line 190W. The layout configuration for the first common connection wiring line 190X1a may be similar to that of the common connection wiring line 190Xa illustrated in FIG. 3B, and the layout configuration of the second common connection wiring line 190X2 may be similar to that of the common connection wiring line 190X illustrated in FIG. 2C.

The number of first erase control transistors ECT1 connected by the first common connection wiring line 190X1a may be less than the number of second erase control transistors ECT2 connected by the second common connection wiring line 190X2. For example, the first common connection wiring line 190X1a extending in the first horizontal direction may be plural and may be connected to the at least two erase control lines ECL among a plurality of first erase control lines ECL1 in one block. The second common connection wiring line 190X2 extending in the first horizontal direction may be connected to the plurality of second erase control lines ECL2 in the one block.

The number of first erase control transistors ECT1 and second erase control transistors ECT2 that are connected by the first common connection wiring line 190X1a and the second common connection wiring line 190X2 may be greater than the number of first string selection transistors SST1 and second string selection transistors SST2 that are connected by the first string selection line SSL1 and the second string selection line SSL2.

Figure 12:
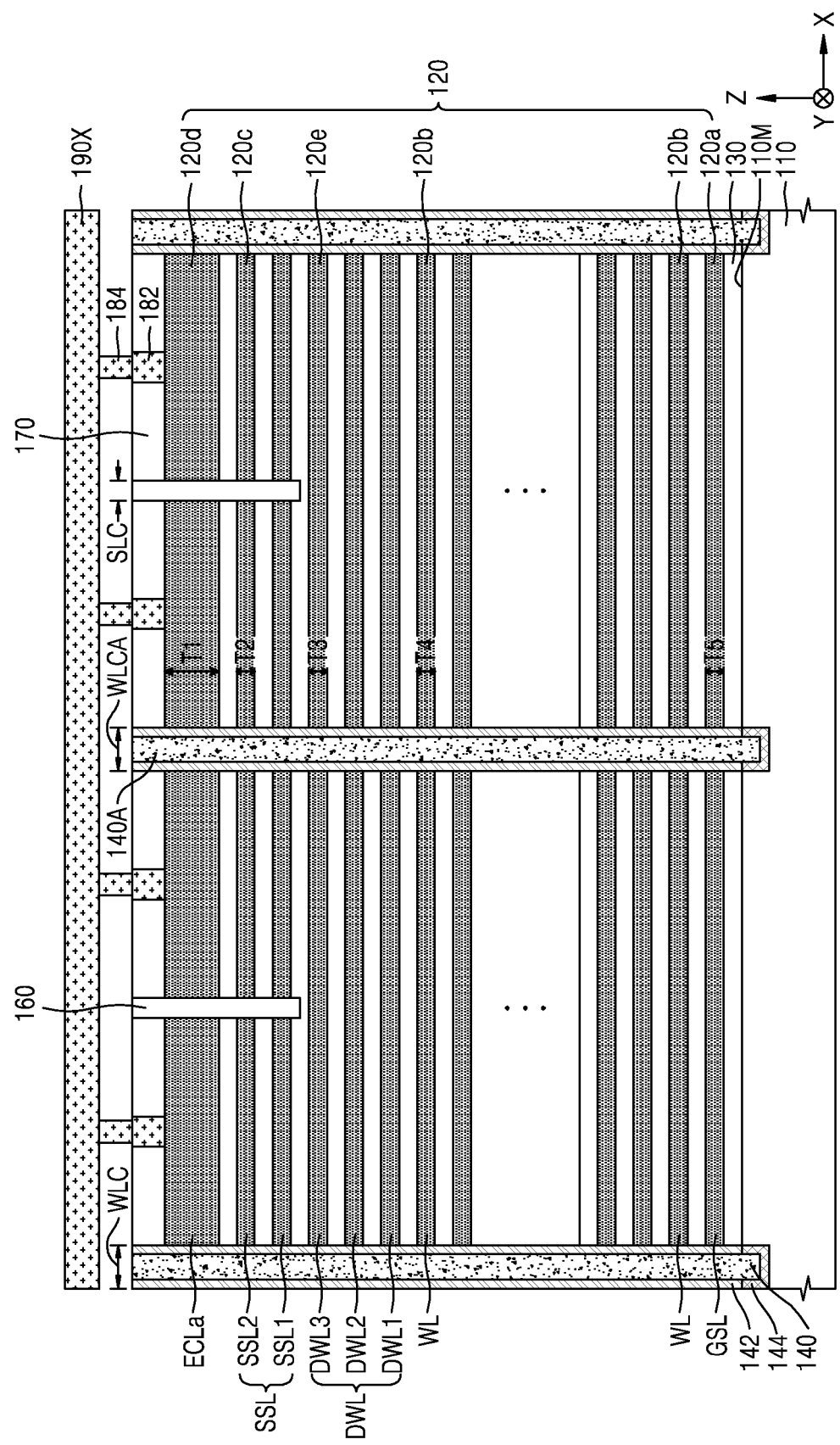
FIGS. 12 and 13 are respective cross-sectional views of integrated circuit devices according to embodiments of the inventive concept.

FIG. 12 is a cross-sectional view of an integrated circuit device 5 according to embodiments of the inventive concept taken along the common connection wiring line 190X for connecting an erase control electrode ECLa. Here, the undescribed portions of the integrated circuit device 5 may be similar in configuration and operation to one or more of the integrated circuit devices previously described in relation to FIGS. 1 through 11, inclusive.

Referring to FIG. 12, the integrated circuit device 5 includes the at least one erase control line ECLa, the at least two string selection lines SSL, the at least one dummy word line DWL, the plurality of word lines WL, and the at least one ground selection line GSL. In some embodiments, the integrated circuit device 5 may include the at least two dummy word lines DWL.

A first thickness T1 associated with a thickness of the erase control line ECLa may be greater than a second thickness T2 associated with a thickness of the string selection line SSL, a third thickness T3 associated with a thickness of the dummy gate line DWL, and/or a fourth thickness T4 associated with a thickness of a gate line WL. In some embodiments, a fifth thickness T5 associated with a thickness of the ground selection line GSL may be greater than the second thickness T2, the third thickness T3, and/or the fourth thickness T4. In some embodiments, the first thickness T1 may be greater than or equal to the fifth thickness T5.

Figure 13:
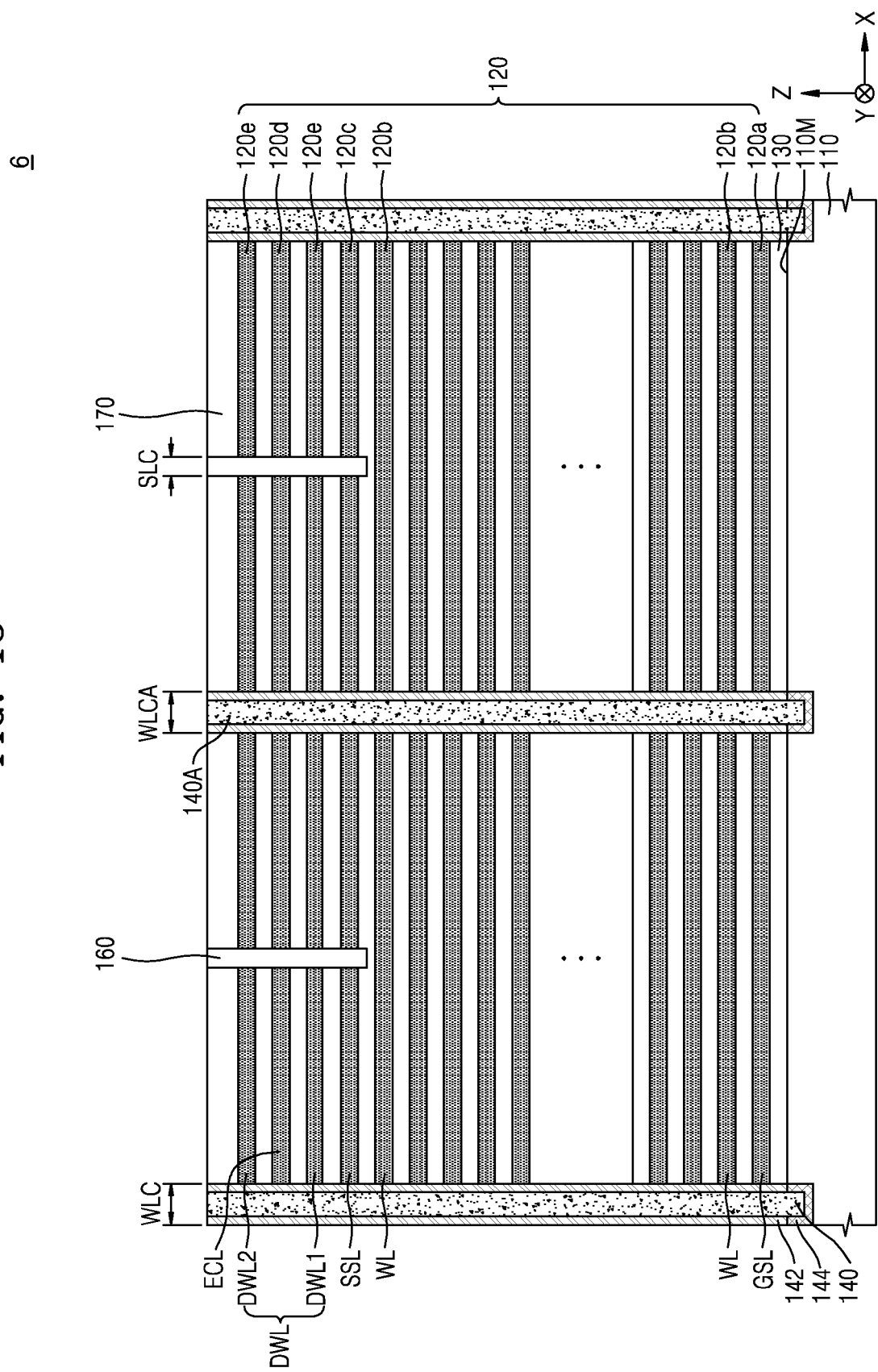

FIG. 13 is a cross-sectional view of an integrated circuit device 6 according to embodiments of the inventive concept. Here, the undescribed portions of the integrated circuit device 6 may be similar in configuration and operation to one or more of the integrated circuit devices previously described in relation to FIGS. 1 through 12, inclusive.

Referring to FIG. 13, the integrated circuit device 6 includes the at least one erase control line ECL, the at least one string selection line SSL, the at least two dummy word lines DWL, the plurality of word lines WL, and the at least one ground selection line GSL.

The at least two dummy word lines DWL may include a first dummy word line DWL1 disposed between the at least one erase control line ECL and the at least one string selection line SSL and a second dummy word line DWL2 disposed above the at least one erase control line ECL. In some embodiments, the at least two dummy word lines DWL may further include a third dummy word line disposed between the at least one string selection line SSL and the plurality of word lines WL.

The first thickness T1 associated with a thickness of the erase control line ECLa may be greater than a second thickness T2 associated with a thickness of the string selection line SSL, a third thickness T3 associated with a thickness of the dummy gate line DWL, and/or a fourth thickness T4 associated with a thickness of the gate line WL. In some embodiments, a fifth thickness T5 associated with a thickness of the ground selection line GSL may be greater than the second thickness T2, the third thickness T3, and/or the fourth thickness T4. In some embodiments, the first thickness T1 may be greater than or equal to the fifth thickness T5.

Figure 14:
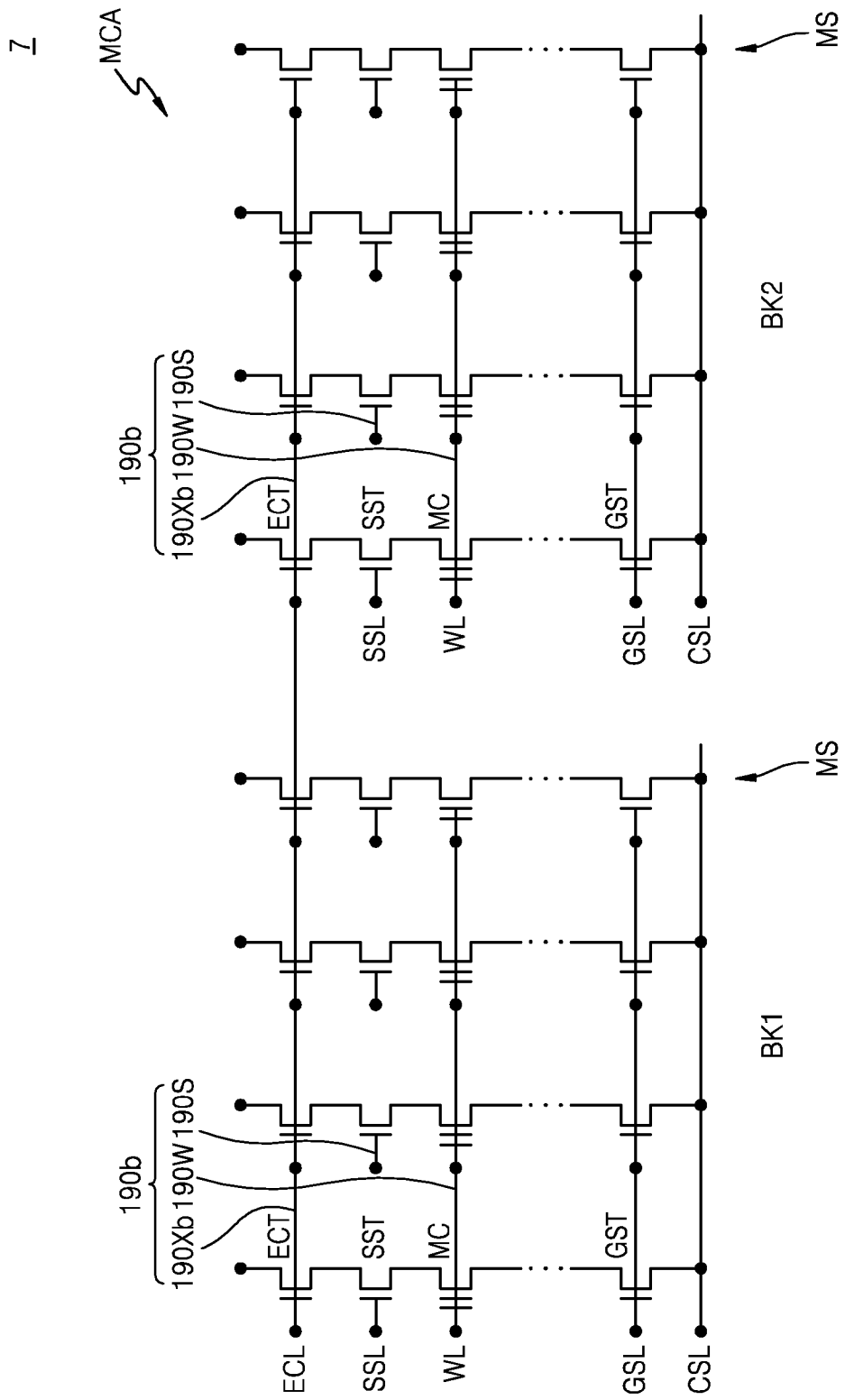
FIGS. 14 and 15 are respective equivalent circuit diagrams of memory cell arrays of integrated circuit devices according to embodiments of the inventive concept.

FIG. 14 is an equivalent circuit diagram for a memory cell array of an integrated circuit device 7 according to embodiments of the inventive concept. Here, the undescribed portions of the integrated circuit device 7 may be similar in configuration and operation to one or more of the integrated circuit devices previously described in relation to FIGS. 1 through 13, inclusive.

Referring to FIG. 14, the integrated circuit device 7 comprises at least two blocks including a first block BK1 and a second block BK2.

A plurality of connection wiring lines 190b may include a common connection wiring line 190Xb, the string connection wiring line 190S, and the gate connection wiring line 190W. The common connection wiring line 190Xb may connect erase control lines ECL in different blocks, that is, the erase control line ECL in the first block BK1 and the erase control line ECL in the second block BK2. For example, the common connection wiring line 190Xb may connect an erase control transistor ECT in the first block BK1 and an erase control transistor ECT in the second block BK2.

Figure 15:
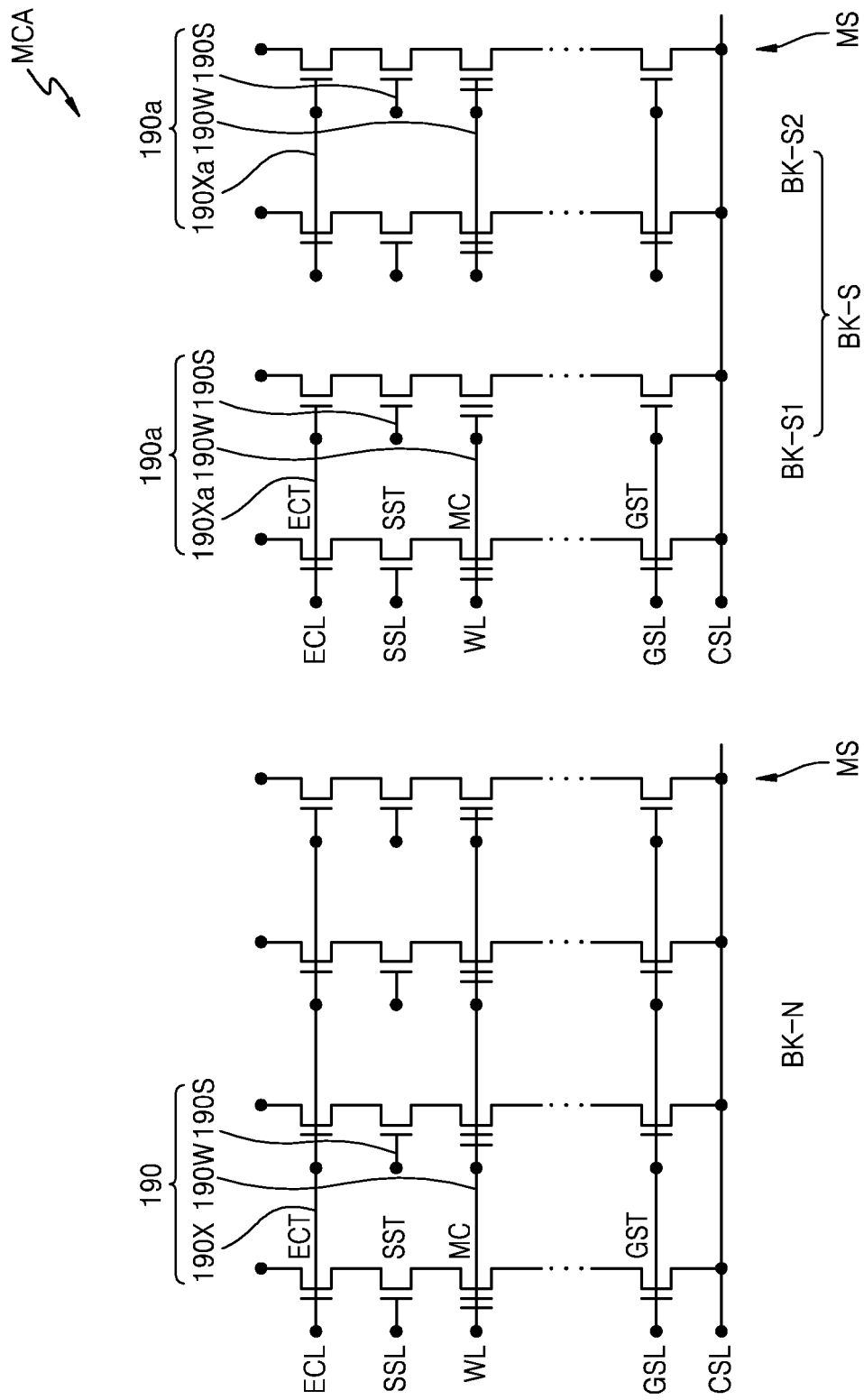

FIG. 15 is an equivalent circuit diagram for a memory cell array of an integrated circuit device 7 according to embodiments of the inventive concept. Here, the undescribed portions of the integrated circuit device 5 may be similar in configuration and operation to one or more of the integrated circuit devices previously described in relation to FIGS. 1 through 14, inclusive.

Referring to FIG. 15, the integrated circuit device 7 comprises at least two blocks including a common block BK-N and a spare block BK-S. The spare block BK-S may have at least two sub-blocks including a first sub-block BK-S1 and a second sub-block BK-S2. When a defect occurs in one of a plurality of memory cell strings MS of the common block BK-N, the spare block BK-S may provide a memory cell string MS that replaces the memory cell string MS with the defect.

The common connection wiring line 190X of the common block BK-N may connect a plurality of erase control transistors ECT of the common block BK-N as illustrated in FIGS. 1 to 2C. On the other hand, the common connection wiring line 190Xa of the spare block BK-S may be plural and may connect at least two erase control transistors ECT among a plurality of erase control transistors ECT of the spare block BK-S. For example, one of the plurality of common connection wiring lines 190Xa of the spare block BK-S connects all of a plurality of erase control transistors ECT in the first sub-block BK-S1 and another one of the plurality of common connection wiring lines 190Xa of the spare block BK-S may connect all of a plurality of erase control transistors ECT in the first sub-block BK-S1.

Figure 16:
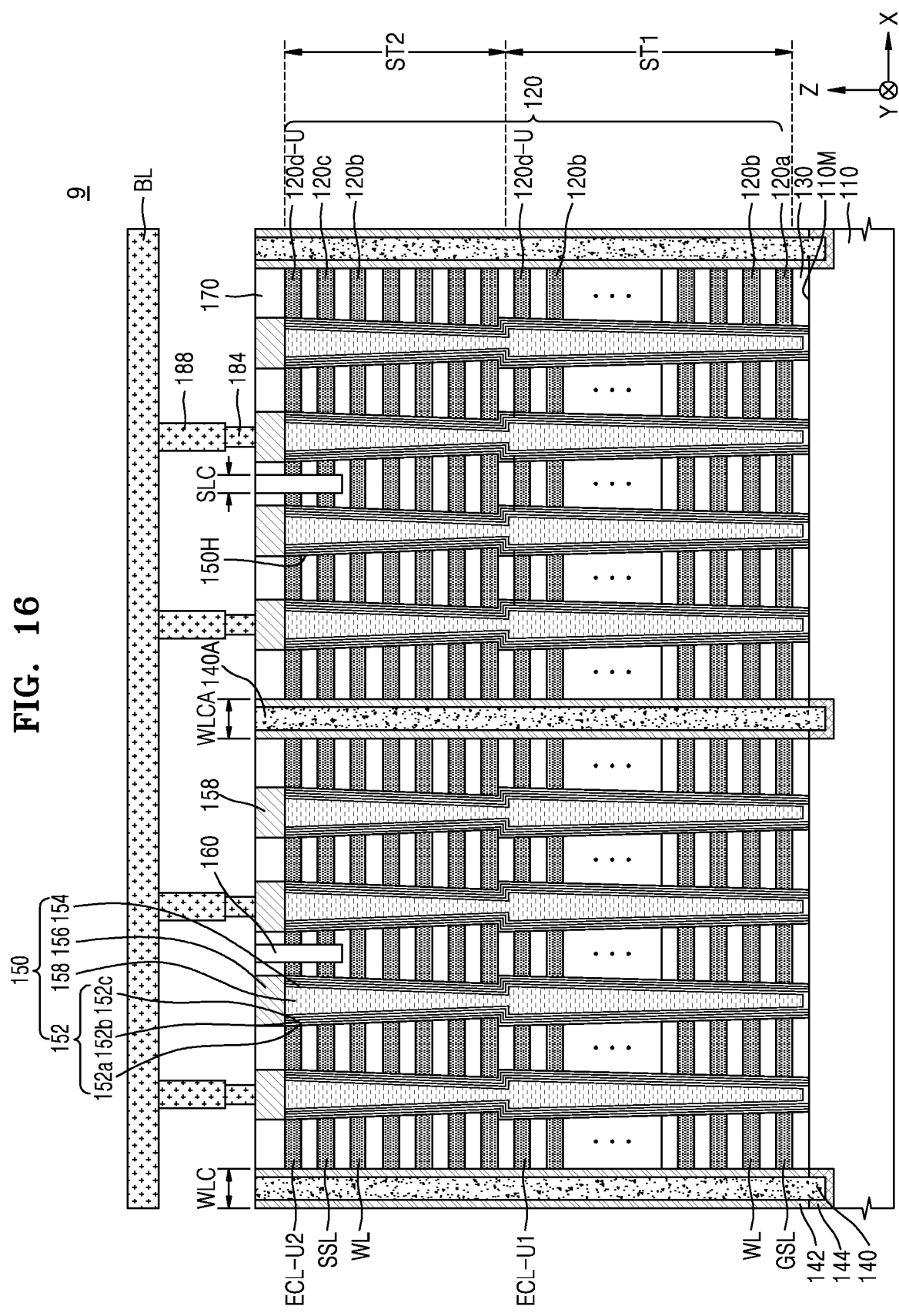
FIGS. 16, 17 and 18 are respective cross-sectional views of integrated circuit devices according to embodiments of the inventive concept.
Figure 17:
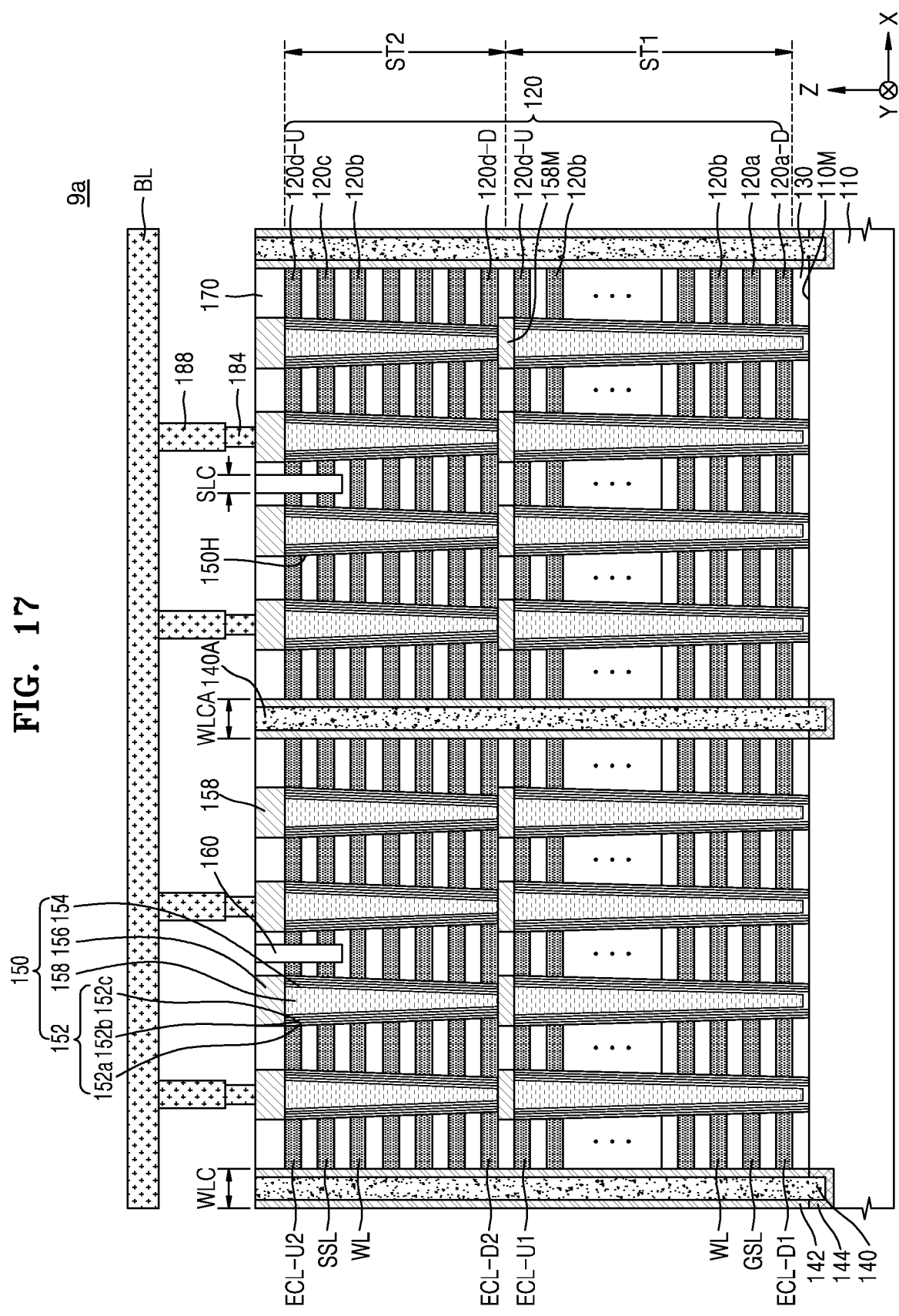
Figure 18:
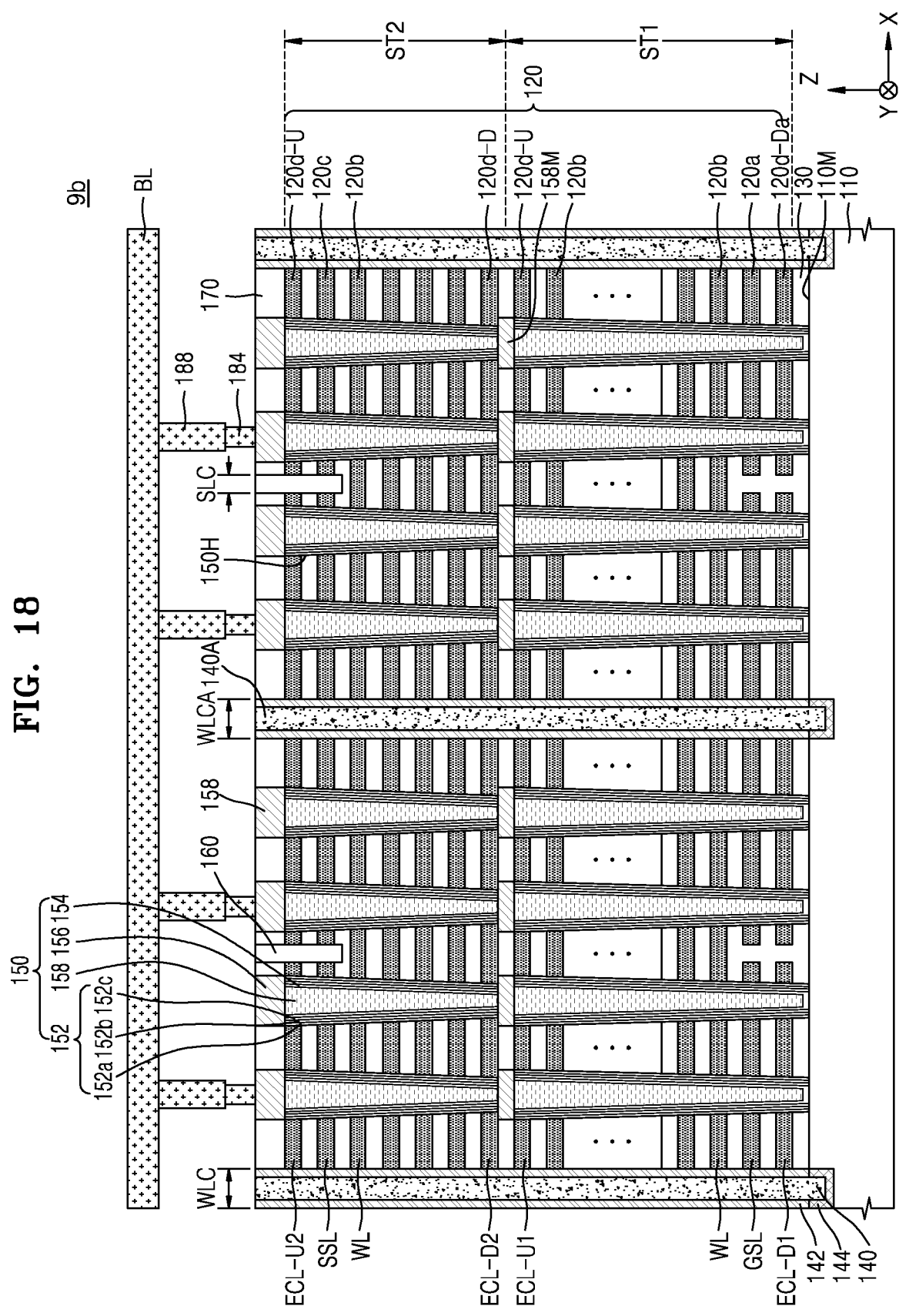

FIGS. 16, 17 and 18 are respective cross-sectional views of integrated circuit devices 9, 9a, and 9b according to embodiments of the inventive concept. Here, the undescribed portions of the integrated circuit devices 9, 9a and 9b may be respectively similar in configuration and operation to one or more of the integrated circuit devices previously described in relation to FIGS. 1 through 15, inclusive.

Referring to FIGS. 16, 17 and 18, each of the integrated circuit devices 9, 9a, and 9b comprises a plurality of stacks including a first stack structure ST1 in a lower portion and a second stack structure ST2 in an upper portion.

In each of the integrated circuit devices 9, 9a, and 9b, after previously forming the plurality of gate electrodes 120 and the plurality of channel holes 150H of the first stack structure ST1, the plurality of gate electrodes 120 and the plurality of channel holes 150H of the second stack structure ST2 may be formed on the first stack structure ST1. In some embodiments, the gate insulating layer 152, the channel layer 154, and the buried insulating layer 156 included in each of the plurality of channel structures 150 may be integrated in each of the plurality of channel holes 150H of the first stack structure ST1 and each of the plurality of channel holes 150H of the second stack structure ST2. In other embodiments, the gate insulating layer 152, the channel layer 154, and the buried insulating layer 156 included in each of the plurality of channel structures 150 may be separately formed in each of the plurality of channel holes 150H of the first stack structure ST1 and each of the plurality of channel holes 150H of the second stack structure ST2.

Each of the plurality of channel holes 150H of the first stack structure ST1 and each of the plurality of channel holes 150H of the second stack structure ST2 may be tapered so that a width in the horizontal directions is reduced from an upper portion toward a lower portion. Each of the plurality of channel holes 150H may have a step difference at a boundary between the first stack structure ST1 and the second stack structure ST2. For example, a width of the uppermost end of each of the plurality of channel holes 150H of the first stack structure ST1 in the horizontal directions may be greater than a width of the lowermost end of each of the plurality of channel holes 150H of the second stack structure ST2.

Referring to FIG. 16, in the integrated circuit device 9, the gate insulating layer 152, the channel layer 154, and the buried insulating layer 156 included in each of the plurality of channel structures 150 of the first stack structure ST1 and each of the plurality of channel structures 150 of the second stack structure ST2 may be directly connected.

The first stack structure ST1 may have the upper erase control lines ECL-U1 and the upper erase control lines ECL-U2. That is, the first stack structure ST1 may have the ground selection lines GSL and may not have the string selection lines SSL and the second stack structure ST2 may have the string selection lines SSL and may not have the ground selection lines GSL.

The number of upper erase control lines ECL-U2 of the second stack structure ST2, which are disposed in the first horizontal direction, may be equal to the number of string selection lines SSL and may be greater than the number of upper erase control lines ECL-U1 of the first stack structure ST1.

Referring to FIG. 17, in the integrated circuit device 9a, connection conductive plugs 158M may be disposed between the plurality of channel structures 150 of the first stack structure ST1 and the plurality of channel structures 150 of the second stack structure ST2. For example, the connection conductive plugs 158M may include the same material as that of the conductive plugs 158.

The first stack structure ST1 may have the upper erase control lines ECL-U1 and lower erase control lines ECL-D1. The second stack structure ST2 may have the upper erase control lines ECL-U2 and lower erase control lines ECL-D2. That is, the first stack structure ST1 may have the ground selection lines GSL and may not have the string selection lines SSL and the second stack structure ST2 may have the string selection lines SSL and may not have the ground selection lines GSL.

In the integrated circuit device 9a, the number of upper erase control lines ECL-U2 of the second stack structure ST2, which are disposed in the first horizontal direction, may be equal to the number of string selection lines SSL and may be greater than the number of lower erase control lines ECL-D2 of the second stack structure ST2, the number of upper erase control lines ECL-U1 of the first stack structure ST1, and the number of lower erase control lines ECL-D1 of the first stack structure ST1. For example, the number of upper erase control lines ECL-U2 of the second stack structure ST2 may be twice the number of lower erase control lines ECL-D2 of the second stack structure ST2, the number of upper erase control lines ECL-U1 of the first stack structure ST1, and the number of lower erase control lines ECL-D1 of the first stack structure ST1. In some embodiments, the number of upper erase control lines ECL-U2 of the second stack structure ST2, which are disposed in the first horizontal direction, may be equal to the number of upper erase control lines ECL-U1 of the first stack structure ST1.

Referring to FIG. 18, in the integrated circuit device 9b, the number of upper erase control lines ECL-U2 of the second stack structure ST2, which are disposed in the first horizontal direction, and the number of lower erase control lines ECL-D1 of the first stack structure ST1 may be equal to the number of string selection lines SSL and may be greater than the number of lower erase control lines ECL-D2 of the second stack structure ST2 and the number of upper erase control lines ECL-U1 of the first stack structure ST1. For example, the number of upper erase control lines ECL-U2 of the second stack structure ST2 and the number of lower erase control lines ECL-D1 of the first stack structure ST1 may be twice the number of lower erase control lines ECL-D2 of the second stack structure ST2 and the number of upper erase control lines ECL-U1 of the first stack structure ST1.

In some embodiments, the number of lower erase control lines ECL-D1 of the first stack structure ST1, which are disposed in the first horizontal direction, may be equal to the number of ground selection lines GSL. In some embodiments, the number of upper erase control lines ECL-U2 of the second stack structure ST2, which are disposed in the first horizontal direction, may be equal to the number of upper erase control lines ECL-U1 of the first stack structure ST1.

Figure 19:
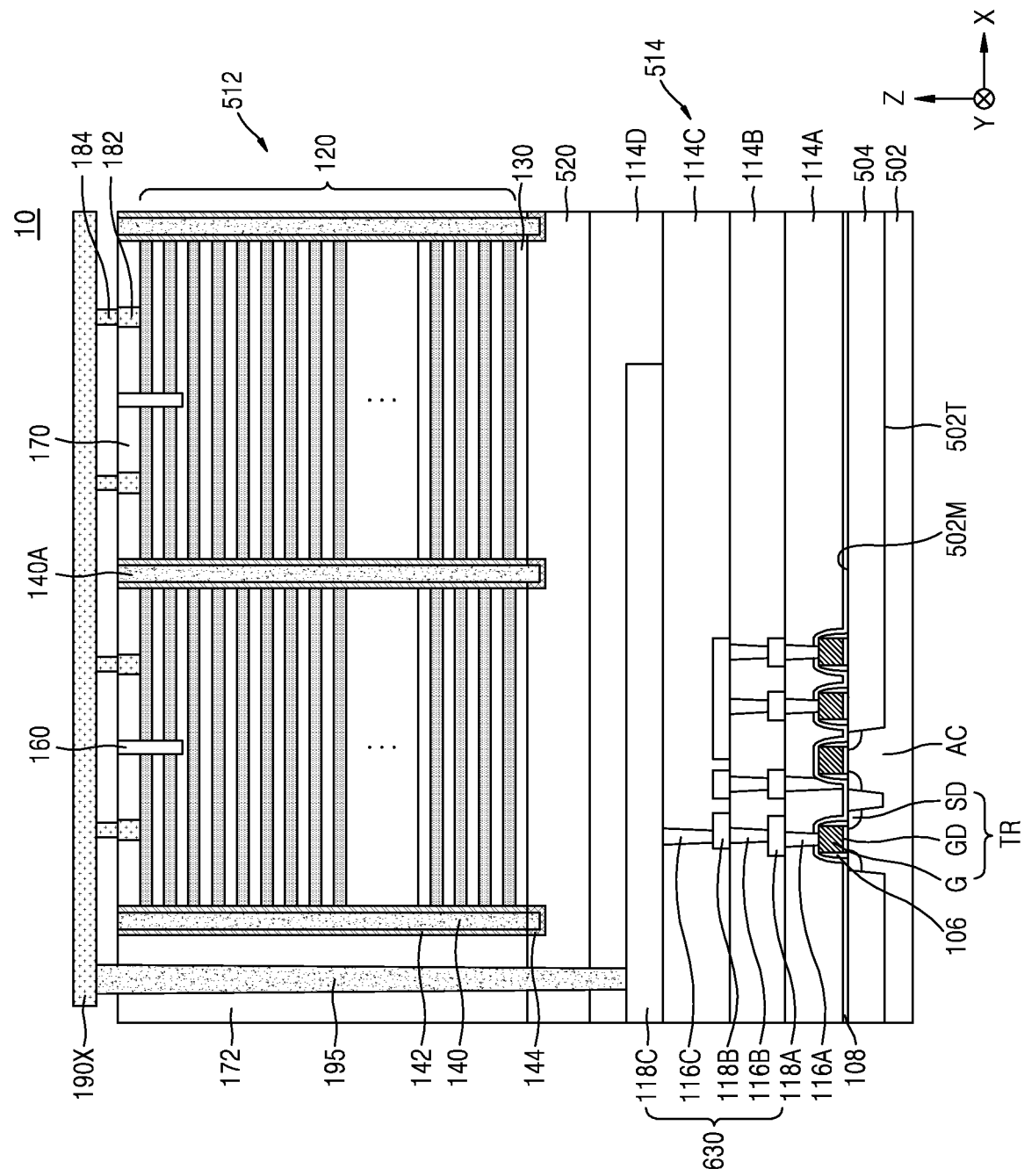
FIG. 19 is a cross-sectional view of an integrated circuit device according to an embodiment of the inventive concept.

FIG. 19 is a cross-sectional view of an integrated circuit device 10 according to embodiments of the inventive concept. Here, undescribed portions of the integrated circuit device 10 may be similar in configuration and operation to one or more of the integrated circuit devices previously described in relation to FIGS. 1 through 18, inclusive.

Referring to FIG. 19, the integrated circuit device 10 comprises a peripheral circuit region 514 formed at a first level on a substrate 502, and a memory cell array region 512 formed at a second level higher than the first level on the substrate 502. Here, the term "level" denotes a relative height above the substrate 502 in the vertical direction, wherein in the illustrated example, the first level is closer to the substrate 502 than the second level.

In some embodiments, the substrate 502 may have a main surface 502M extending in the first and second horizontal directions. In certain embodiments, the substrate 502 may be similar to the substrate 110 described with reference to FIGS. 2A, 2B and 2C.

A peripheral circuit active region AC may be defined by an isolation layer 504 on the substrate 502. A plurality of transistors TR may be configured in the peripheral circuit region 514 of the peripheral circuit active region AC of the substrate 502. Each of the plurality of transistors TR may include a gate G, a gate dielectric layer GD, and a source/drain region SD. Both side walls of the gate G may be covered with an insulating spacer 106. An etch stop layer 108 may be formed on the gate G and the insulating spacer 106. The etch stop layer 108 may include an insulating material such as a silicon nitride or a silicon oxynitride.

A plurality of interlayer insulating layers 114A, 114B, 114C, and 114D may be sequentially stacked on the etch stop layer 108. The plurality of interlayer insulating layers 114A, 114B, 114C, and 114D may include a silicon oxide and a silicon oxynitride. The peripheral circuit region 514 includes a multilayer wiring line structure 630 connected to the plurality of transistors TR. The multilayer wiring line structure 630 may be insulated by the plurality of interlayer insulating layers 114A, 114B, 114C, and 114D.

The multilayer wiring line structure 630 may include a first contact 116A, a first wiring line layer 118A, a second contact 116B, a second wiring line layer 118B, a third contact 116C, and a third wiring line layer 118C that are sequentially stacked on the substrate 502 and are connected to one another.

A semiconductor layer 520 that covers the plurality of interlayer insulating layers 114A, 114B, 114C, and 114D is formed on the peripheral circuit region 514. The memory cell array region 512 is formed on the semiconductor layer 520. The memory cell array region 512 has the same configuration as that of the memory cell array region MCA of each of the integrated circuit devices 1, 1a, 2, 2a, 2b, 2c, 2d, 3, 4, 4a, 5, 6, 7, 8, 9, 9a, and 9b, previously described with reference to FIGS. 1 through 19.

In the integrated circuit device 10, the memory cell array region 512 and the peripheral circuit region 514 may be connected through at least one connection plug 195 vertically extending upward through a fill insulating layer 172. For example, the common connection wiring line 190X of the memory cell array region 512 may be connected to the peripheral circuit region 514 through the at least one connection plug 195. The at least one connection plug 195 may be connected to the multilayer wiring line structure 630. For example, the at least one connection plug 195 may be connected to a third wiring line layer 118C.

The integrated circuit device 10 has a multilayer device structure in which a first level semiconductor device and a second level semiconductor device having different functions are stacked to vertically overlap at different levels. Therefore, it is possible to prevent densities of wiring line patterns that configure the multilayer wiring line structure 630 from excessively increasing in the memory cell array region 512 and to simplify processes of manufacturing the integrated circuit device. In addition, by reducing the number of stacked metal wiring line layers having the multilayer wiring line structure, it is possible to reduce physical stress caused by metal wiring lines and to prevent the substrate from being curved.

While the inventive concept has been particularly shown and described with reference to embodiments thereof, it will be understood that various changes in form and details may be made therein without departing from the spirit and scope of the following claims.

What is claimed is:

1. An integrated circuit device comprising:
   a plurality of channel structures extending in a vertical direction from a main surface of a substrate;
   a plurality of memory cell strings disposed in the vertical direction along the plurality of channel structures, wherein each memory cell string includes a plurality of serially-connected memory cells;
   a plurality of gate lines spaced apart from one another in the vertical direction and including erase control lines and string selection lines; and
   a plurality of driving transistors including erase control driving transistors connected to the erase control lines and string selection driving transistors connected to the string selection lines,
   wherein at least two gate lines spaced apart from one another in a horizontal direction with respect to the main surface of the substrate among the plurality of gate lines are commonly connected to one of the plurality of driving transistors.

2. The integrated circuit device of claim 1, wherein at least two erase control lines are spaced apart from one another in the horizontal direction and are commonly connected by a common connection wiring line extending in the horizontal direction.

3. The integrated circuit device of claim 2, further comprising:
   a plurality of bit lines respectively connected to the plurality of memory cell strings, extending in the horizontal direction, and disposed at a level different from that of the common connection wiring line.

4. The integrated circuit device of claim 2, further comprising:
   at least two blocks including a first block and a second block,
   wherein the common connection wiring line commonly connects erase control lines of the first block to erase control lines of the second block.

5. The integrated circuit device of claim 1, wherein a thickness of at least one of the erase control lines is greater than a thickness of at least one of the string selection lines.

6. The integrated circuit device of claim 1, further comprising:
   a plurality of word lines respectively connected to the plurality of memory cell strings,
   wherein a width of each one of the plurality of word lines in the horizontal direction is at least twice a width of each one of the plurality of gate lines.

7. The integrated circuit device of claim 6, wherein each one of the plurality of channel structures includes a gate insulating layer contacting at least one of the plurality of gate lines and at least one of the plurality of word lines, and
   a thickness of a first portion of the gate insulating layer facing a side surface of the erase control line is less than a thickness of a second portion of the gate insulating layer facing side surfaces of the plurality of word lines.

8. The integrated circuit device of claim 6, wherein each one of the plurality of channel structures includes a gate insulating layer contacting at least one of the plurality of gate lines and at least one of the plurality of word lines, and
   a thickness of a first portion of the gate insulating layer contacting a side surface of the erase control line is less than a thickness of a second portion of the gate insulating layer contacting a side surface of the string selection line.

9. The integrated circuit device of claim 6, wherein each one of the plurality of channel structures includes a gate insulating layer contacting at least one of the plurality of gate lines and at least one of the plurality of word lines, and
   a thickness of a first portion of the gate insulating layer contacting a side surface of the string selection line is less than a thickness of a second portion of the gate insulating layer contacting a side surface of at least one of the plurality of word lines.

10. The integrated circuit device of claim 6, wherein each one of the plurality of channel structures includes a gate insulating layer contacting at least one of the plurality of gate lines and at least one of the plurality of word lines, and
    a channel layer disposed on the gate insulating layer, and
    an uppermost end of the channel layer is disposed at a level less than or equal to a level at which an uppermost end of the gate insulating layer is disposed.

11. The integrated circuit device of claim 1, wherein at least two erase control lines spaced apart from one another in the horizontal direction are commonly connected to one erase control driving transistor, and
    each of the at least two string selection lines spaced apart from one another in the horizontal direction is connected to one of the at least two string selection driving transistors.

12. The integrated circuit device of claim 1, wherein, in at least one of the erase control lines and one of the string selection lines are spaced apart from one another in the vertical direction.

13. An integrated circuit device comprising:
    channel structures extending in a vertical direction from a substrate;
    bit lines respectively connected to the channel structures and extending in a first horizontal direction;
    gate electrodes vertically stacked on the substrate, intersecting the channel structures, having a stepped pattern, and extending in a second horizontal direction over the substrate; and
    an erase control driving transistor and at least two string selection driving transistors,
    wherein at least two of the gate electrodes respectively function as erase control lines, at least another two of the gate electrodes respectively function as string selection lines, the erase control lines and the string selection lines are spaced apart from one another in the first horizontal direction, the erase control lines are commonly connected to the erase control driving transistor, and each of the string selection lines is respectively connected to one of the at least two string selection driving transistors.

14. The integrated circuit device of claim 13, further comprising:
a common connection wiring line extending from one end of each of the at least two erase control lines in the first horizontal direction,
wherein the at least two erase control lines are commonly connected by the common connection wiring line.

15. The integrated circuit device of claim 14, wherein the bit lines extend in the first horizontal direction at a level different from that of the common connection wiring line.

16. The integrated circuit device of claim 13, wherein the gate electrode other than the at least two of the gate electrodes functioning as erase control lines and the at least another two of the gate electrodes functioning as string selection lines function as word lines, and
a width of each one of the at least two erase control lines and the at least two string selection lines is less than one half of a width of each one of the word lines in the first horizontal direction.

17. An integrated circuit device comprising:
channel structures extending in a vertical direction from a substrate;
memory cell strings disposed in the vertical direction along the channel structures, wherein each one of the memory cell strings includes serially-connected memory cells;
gate electrodes spaced apart from one another in the vertical direction, intersecting the channel structures, and extending in a second horizontal direction over the substrate; and
driving transistors including erase control driving transistors and string selection driving transistors,
wherein the gate electrodes include word lines, erase control lines, and string selection lines,
the at least two of the erase control lines are spaced apart from one another in a first horizontal direction and are commonly connected to one erase control driving transistor, and
the at least two string selection lines are spaced apart from one another in the first horizontal direction and are respectively connected to the at least two string selection driving transistors.

18. The integrated circuit device of claim 17, wherein a width of each one of the word lines is at least twice that of a width of each one of the erase control lines and the string selection lines in the first horizontal direction.

19. The integrated circuit device of claim 17, wherein a common connection wiring line commonly connects the at least two erase control lines to at least two of the bit lines.

20. The integrated circuit device of claim 19, wherein the common connection wiring line extends from a stepped one end of the erase control line in the first horizontal direction.

* * * * *